United States Patent
Ammann et al.

(10) Patent No.: US 12,316,304 B2
(45) Date of Patent: May 27, 2025

(54) VERTICALLY COUPLED SAW RESONATORS

(71) Applicant: RF360 SINGAPORE PTE. LTD., Republic Plaza (SG)

(72) Inventors: Stefan Ammann, Grosskarolinenfeld (DE); Matthias Pernpeintner, Grafing b. München (DE); Manuel Hofer, Graz (AT); Stefan Leopold Hatzl, Kloech (AT)

(73) Assignee: RF360 Singapore Pte. Ltd., Republic Plaza (SG)

( * ) Notice: Subject to any disclaimer, the term of this patent is extended or adjusted under 35 U.S.C. 154(b) by 219 days.

(21) Appl. No.: 18/069,958

(22) Filed: Dec. 21, 2022

(65) Prior Publication Data

US 2024/0213958 A1 Jun. 27, 2024

(51) Int. Cl.
*H03H 9/64* (2006.01)
*H03H 3/08* (2006.01)
(Continued)

(52) U.S. Cl.
CPC ............ *H03H 9/6483* (2013.01); *H03H 3/08* (2013.01); *H03H 9/1092* (2013.01); *H03H 9/145* (2013.01); *H03H 9/25* (2013.01)

(58) Field of Classification Search
CPC ........ H03H 9/64; H03H 9/585; H03H 9/6483; H03H 9/1092; H03H 3/08
(Continued)

(56) References Cited

U.S. PATENT DOCUMENTS

| 6,441,703 B1 * | 8/2002 | Panasik | H03H 9/589 |
| | | | 29/25.35 |
| 11,095,267 B2 * | 8/2021 | Kreuzer | H03H 9/584 |

(Continued)

FOREIGN PATENT DOCUMENTS

| CN | 111030626 A | 4/2020 |
| JP | 2007060465 A | 3/2007 |

(Continued)

OTHER PUBLICATIONS

Koh K., et al., "Fabrication of SAW devices with Small Package Size Using Through Substrate Via Technology", 2009 IEEE International Ultrasonics Symposium Proceedings, Sep. 20-23, 2009, pp. 2688-2691.

(Continued)

*Primary Examiner* — Rakesh B Patel
(74) *Attorney, Agent, or Firm* — Polsinelli

(57) ABSTRACT

Aspects of the disclosure relate to devices, wireless communication apparatuses, methods, and circuitry implementing filters with electroacoustic vertical coupling. One aspect is a filter comprising a piezoelectric substrate having a first piezoelectric surface and a second piezoelectric surface opposite the first piezoelectric surface. The filter further comprises a first electroacoustic resonator comprising a first interdigital transducer (IDT) disposed on or over the first piezoelectric surface of the piezoelectric substrate and a second electroacoustic resonator comprising a second IDT disposed on or over the second piezoelectric surface of the piezoelectric substrate. The second electroacoustic resonator is electrically coupled to the first electroacoustic resonator in series or in parallel.

30 Claims, 23 Drawing Sheets

(51) Int. Cl.
  *H03H 9/10* (2006.01)
  *H03H 9/145* (2006.01)
  *H03H 9/25* (2006.01)

(58) Field of Classification Search
  USPC .......................................... 333/186, 190–193
  See application file for complete search history.

(56) References Cited

U.S. PATENT DOCUMENTS

| | | |
|---|---|---|
| 2012/0205754 A1 | 8/2012 | Iwamoto |
| 2015/0228694 A1* | 8/2015 | Brawley .............. H10N 30/853 257/254 |
| 2017/0331455 A1 | 11/2017 | Kuroyanagi |
| 2017/0353173 A1 | 12/2017 | Sakurai et al. |
| 2019/0356297 A1* | 11/2019 | Komiyama .......... B23K 26/402 |
| 2020/0395915 A1 | 12/2020 | Giner De Haro et al. |
| 2022/0321096 A1 | 10/2022 | Goto et al. |
| 2023/0009638 A1 | 1/2023 | Weng et al. |

FOREIGN PATENT DOCUMENTS

| | | |
|---|---|---|
| JP | 2008160694 A | 7/2008 |
| WO | 2010103713 A1 | 9/2010 |

OTHER PUBLICATIONS

Koh K., et al., "Study on SAW Devices Having Face to Face Aligned Packaged Structure," 2008 IEEE Ultrasonics Symposium, 2008, pp. 1596-1599, doi: 10.1109/ULTSYM.2008.0389.

Schober J., et al., "Copper Pillar Bumps on Acoustic Wave Components," 2019 22nd European Microelectronics and Packaging Conference & Exhibition (EMPC), 2019, 8 Pages, doi: 10.23919/EMPC44848.2019.8951847.

Partial International Search Report—PCT/SG2023/050776—ISA/EPO—Mar. 13, 2024.

International Search Report and Written Opinion—PCT/SG2023/050776—ISA/EPO—Jun. 10, 2024.

* cited by examiner

VERTICALLY COUPLED SAW RESONATORS

FIELD

The present disclosure relates generally to electronic communications and surface acoustic wave (SAW) circuits. For example, aspects of the present disclosure relate to surface acoustic wave (SAW) filter circuits in stacked packages with vertical coupling across a piezoelectric substrate.

BACKGROUND

Electronic devices include traditional computing devices, such as desktop computers, notebook computers, tablet computers, smartphones, wearable devices like a smartwatch, internet servers, and so forth. These various electronic devices provide information, entertainment, social interaction, security, safety, productivity, transportation, manufacturing, and other services to human users. These various electronic devices depend on wireless communications for many of their functions. Wireless communication systems and devices are widely deployed to provide various types of communication content, such as voice, video, packet data, messaging, broadcast, and so on. These systems may be capable of supporting communication with multiple users by sharing the available system resources (e.g., time, frequency, and power). Aspects of such systems include code division multiple access (CDMA) systems, time division multiple access (TDMA) systems, frequency division multiple access (FDMA) systems, and orthogonal frequency division multiple access (OFDMA) systems, (e.g., a Long Term Evolution (LTE) system, or a New Radio (NR) system).

Wireless communication transceivers used in these electronic devices generally include multiple radio frequency (RF) filters for filtering a signal for a particular frequency or range of frequencies. Electroacoustic devices (e.g., "acoustic filters" or "acoustic wave (AW) filters") are used for filtering signals in many applications. Using a piezoelectric material as a vibrating medium, acoustic resonators operate by transforming an electrical signal wave, that is propagating along an electrical conductor, into an acoustic wave that is propagating via the piezoelectric material. The acoustic wave propagates at a velocity having a magnitude that is significantly less than that of the propagation velocity of the electromagnetic wave. Generally, the magnitude of the propagation velocity of a wave is proportional to a size of a wavelength of the wave. Consequently, after conversion of an electrical signal into an acoustic signal, the wavelength of the acoustic signal wave is significantly smaller than the wavelength of the electrical signal wave. The resulting smaller wavelength of the acoustic signal enables filtering to be performed using a smaller filter device. The smaller filter device permits acoustic resonators to be used in electronic devices having size constraints, such as the electronic devices enumerated above (e.g., particularly including portable electronic devices, such as cellular phones). Such AW filters can, however, continue to be improved with adjustments to shrink devices size and improve device performance.

SUMMARY

Disclosed are systems, apparatuses, methods, and computer-readable media for electronic communications and, more specifically, wireless communication apparatuses, and circuitry implementing acoustic wave (AW) resonator packages with resonators fabricated for vertical coupling. Aspects can include electroacoustic structures (e.g., electroacoustic resonators that use interdigital transducers) configured such that resonators on opposite sides of a piezoelectric substrate (e.g., vertically stacked resonators) can be part of the same filter, and can optionally have characteristics impacted by coupling across the piezoelectric substrate.

According to at least one example, an acoustic wave (AW) filter is provided. The AW filter comprises a piezoelectric substrate comprising: a first piezoelectric layer having a first piezoelectric surface and a second piezoelectric surface opposite the first piezoelectric surface: a second piezoelectric layer having a third piezoelectric surface and a fourth piezoelectric surface opposite the third piezoelectric surface; and a spacer layer between the first piezoelectric layer and the second piezoelectric layer, wherein the second piezoelectric surface is opposite the third piezoelectric surface across the spacer layer: a first interdigital transducer (IDT) formed on the first piezoelectric surface of the first piezoelectric layer; and a second IDT formed on the second piezoelectric surface of the first piezoelectric layer; a third IDT formed on the third piezoelectric surface of the second piezoelectric layer; and a fourth IDT formed on the fourth piezoelectric surface of the second piezoelectric layer.

According to another example, a method of fabricating an AW filter package is provided. The method comprises creating one or more via holes through a piezoelectric substrate, wherein the piezoelectric substrate has a first piezoelectric surface and a second piezoelectric surface opposite the first piezoelectric surface: fabricating one or more conductive vias from the first piezoelectric surface to the second piezoelectric surface using the one or more via holes: fabricating a first acoustic layer on the first piezoelectric surface of the piezoelectric substrate, wherein the first acoustic layer comprises one or more first interdigital transducers (IDTs) and one or more connections from the one or more first IDTs to the one or more conductive vias: depositing one or more spacers on the first piezoelectric surface of the piezoelectric substrate, using a resist layer to protect the one or more first IDTs: bonding the one or more spacers to a silicon substrate to mount the piezoelectric substrate on the silicon substrate using the one or more spacers; thinning the piezoelectric substrate to a selected thickness by removing material from the second piezoelectric surface of the piezoelectric substrate; and fabricating a second acoustic layer on the second piezoelectric surface of the piezoelectric substrate, wherein the second acoustic layer comprises one or more second IDTs connected to the one or more first IDTs via the one or more conductive vias, and wherein the one or more first IDTs and the one or more second IDTs are provided as part of a radio frequency filter circuit.

According to at least one example, a radio frequency (RF) filter is provided. The RF filter comprises a piezoelectric substrate having a first piezoelectric surface and a second piezoelectric surface opposite the first piezoelectric surface: a first electroacoustic resonator comprising a first interdigital transducer (IDT) formed on the first piezoelectric surface of the piezoelectric substrate; and a second electroacoustic resonator comprising a second IDT formed on the second piezoelectric surface of the piezoelectric substrate; wherein the second electroacoustic resonator is electrically coupled to the first electroacoustic resonator in series or in parallel.

In some aspects, the RF filter operates where a thickness of the piezoelectric substrate is less than 20 times a minimum of a pitch of the first IDT and a pitch of the second IDT. In some such aspects, the RF filter operates where the thickness of the piezoelectric substrate is greater than 0.1 times the minimum of the pitch of the first IDT and the pitch of the second IDT.

In some aspects, the RF filter operates where the piezoelectric substrate comprises a first piezoelectric layer, the first piezoelectric layer comprising the first surface. In some such aspects, the RF filter operates where the first piezoelectric layer further comprises the second piezoelectric surface; and wherein a thickness of the first piezoelectric layer is between 0.4 times of a minimum of a pitch of the first IDT and a pitch of the second IDT and 2 times the minimum of the pitch of the first IDT and the pitch of the second IDT. In some such aspects, the RF filter operates where the piezoelectric substrate further comprises: a second piezoelectric layer comprising the second piezoelectric surface; and a spacer layer positioned between and in contact with the first piezoelectric layer and the second piezoelectric layer. In some such aspects, the RF filter operates where a thickness of the piezoelectric substrate is less than 20 times a minimum of a pitch of the first IDT and a pitch of the second IDT. In some such aspects, the RF filter further comprises a third electroacoustic resonator comprising a third IDT formed within the spacer layer on a surface of the first piezoelectric layer opposite the first piezoelectric surface. In some such aspects, the RF filter further comprises a fourth electroacoustic resonator comprising a fourth IDT formed within the spacer layer on a surface of the second piezoelectric layer opposite the second piezoelectric surface.

In some such aspects, the RF filter operates where a thickness of the first piezoelectric layer is between 0.4 times a minimum of a pitch of the first IDT and a pitch of the third IDT and 2 times the minimum of the pitch of the first IDT and the pitch of the third IDT.

In some such aspects, the RF filter operates where a thickness of the second piezoelectric layer is between 0.4 times a minimum of a pitch of the second IDT and a pitch of the fourth IDT and 2 times the minimum of the pitch of the second IDT and the pitch of the fourth IDT.

In some such aspects, the RF filter operates where a thickness of the spacer layer is less than 10 times the minimum of the pitch of the first IDT and the pitch of the second IDT. In some such aspects, the RF filter operates where a thickness of the spacer layer is greater than 10 times a maximum of the pitch of the first IDT and the pitch of the second IDT. In some such aspects, the RF filter operates where a thickness of the spacer layer is less than 1.2 times the minimum of the pitch of the first IDT and the pitch of the second IDT. In some such aspects, the RF filter operates where the spacer layer comprises a dielectric material. In some such aspects, the RF filter operates where the first piezoelectric layer and the second piezoelectric layer are made from a same piezoelectric material.

In some such aspects, the RF filter comprises a silicon substrate, wherein the silicon substrate has a cavity formed in a portion of a surface of the silicon substrate, and wherein the second piezoelectric surface of the piezoelectric substrate shares a boundary with the surface of the silicon substrate, aligned such that the second IDT fits within the cavity without contacting the substrate.

In some aspects, the RF filter further comprises a plurality of spacers positioned on the first piezoelectric surface of the piezoelectric substrate; and a cap mounted on the plurality of spacers, such that the first IDT is positioned in a gap between the first piezoelectric surface of the piezoelectric substrate and the cap.

In some aspects, RF filter operates where the first electroacoustic resonator and the second electroacoustic resonator are part of a ladder filter. In some aspects, RF filter operates where the RF filter is integrated into an RF front-end circuit of a transceiver. In some aspects, RF filter operates where a filter characteristic of the RF filter is based on electroacoustic coupling between the first electroacoustic resonator and the second electroacoustic resonator through the piezoelectric substrate. In some aspects, RF filter operates where the first IDT and the second IDT overlap in a vertical direction such that a vertical projection across the piezoelectric substrate of an area on the first piezoelectric surface that includes the first IDT overlaps with an area on the second piezoelectric surface that includes the second IDT. In some aspects, RF filter operates where the first IDT and the second IDT partially overlap in a vertical direction such that at least a threshold portion (e.g., 25 percent, 50 percent, etc.) of a vertical projection across the piezoelectric substrate of the first IDT overlaps with an area on the second piezoelectric surface that does not include the second IDT.

In some aspects, RF filter further comprises an antenna; and processing circuitry, wherein the antenna and the processing circuitry are communicatively coupled via the RF filter, and wherein the RF filter is configured to filter RF signals traveling between the antenna and the processing circuitry.

In some aspects, the AW filter device or the RF filter is integrated into a device selected from the group consisting of: a set-top box; an entertainment unit; a navigation device; a communications device; a fixed location data unit; a mobile location data unit; a global positioning system (GPS) device; a mobile phone; a cellular phone; a smartphone; a session initiation protocol (SIP) phone; a tablet; a phablet; a server; a computer; a portable computer; a mobile computing device; a wearable computing device; a smartwatch; smart glasses; augmented reality (AR) glasses; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; a vehicular head unit; avionics systems; a drone; and a multicopter.

This summary is not intended to identify key or essential features of the claimed subject matter, nor is it intended to be used in isolation to determine the scope of the claimed subject matter. The subject matter should be understood by reference to appropriate portions of the entire specification of this patent, any or all drawings, and each claim.

The foregoing, together with other features and embodiments, will become more apparent upon referring to the following specification, claims, and accompanying drawings.

DETAILED DESCRIPTION

Figures 1A, 1B:
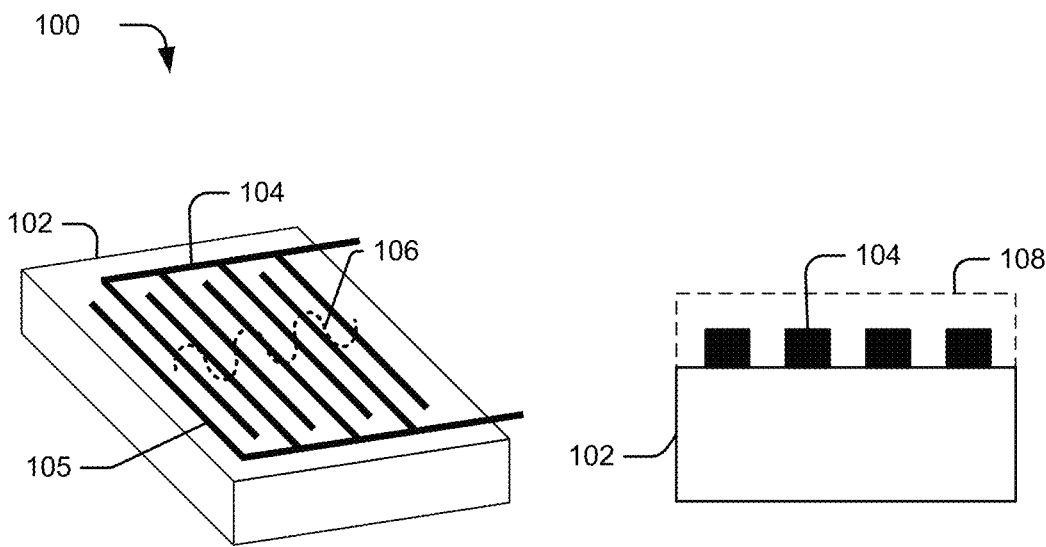
FIG. 1A is a diagram of a perspective view of an example of an electroacoustic device.
FIG. 1B is a diagram of a side view of the electroacoustic device of FIG. 1A.

The detailed description set forth below in connection with the appended drawings is intended as a description of exemplary implementations and is not intended to represent the only implementations in which the invention may be practiced. Aspects specifically described herein are provided as examples, and should not necessarily be construed as preferred or advantageous over other implementations, including the implementations specifically described and any other implementation apparent from the specific aspects described herein. The detailed description includes specific details for the purpose of providing a thorough understanding of the exemplary implementations. In some instances, some devices are shown in block diagram form.

Electroacoustic devices, also referred to herein as acoustic wave (AW) resonators, are devices with high-Q performance characteristics at frequencies above several megahertz (MHz), and provide performance that is valuable in many wireless communication devices. Such resonators in a configuration with acoustic waves propagated along interdigital transducers (IDTs) on a piezoelectric layer are referred to as surface acoustic wave (SAW) resonators. Aspects described herein include devices, methods of fabrication, and other aspects associated with SAW devices having IDTs on a top and a bottom surface of a piezoelectric substrate. A piezoelectric substrate in the present disclosure refers to a layer stack including at least one piezoelectric layer (and optionally one or more additional layers) as described in further detail below. The at least one piezoelectric layer is arranged in the layer stack such that the top and the bottom surface of the piezoelectric substrate are surfaces of piezoelectric layer(s). In other words, the top and bottom layers of a multi-layer stack of the piezoelectric substrate are piezoelectric layers of the same or different piezoelectric materials. The above-mentioned positioning can reduce the space used by a filter that uses the resonators. Additionally, in some aspects, coupling between resonators on opposite surfaces of a piezoelectric substrate can be used to create complex filters as well as reducing a thickness, mass, and weight associated with piezoelectric substrates that are designed to eliminate or minimize vertical coupling between AW resonators.

Some aspects can be used as described herein to offer additional parameter spaces for shaping filter functions when designing devices that use AW filters. In some aspects, differently polarized modes of the vertically coupled IDT pairs can be designed to form a passband, which can allow tailoring of mode characteristics to combine the advantages of two modes. In some aspects, considering the coupling can allow reduced filter size while designing vertical multi-tier packaging that is "almost decoupled", or designed to a size where coupling occurs, but is set to benefit or provide a minimal impact on the filter performance.

Details regarding aspects of the present disclosure are described in more detail below with respect to the figures.

FIG. 1A is a diagram of a perspective view of an example of an electroacoustic device. The electroacoustic device may be configured as, or be a portion of, a surface acoustic wave (SAW) resonator. In certain descriptions herein, the electroacoustic device 100 may be referred to as a SAW resonator which can be incorporated into an AW filter (e.g., AW filters with vertical coupling as described further below). While the examples described below particularly relate to SAW resonators, aspects described herein may be applicable to other types of AW resonators where coupling can be part of a device design. In addition to the SAW devices described below, in some implementations, an AW filter can use a combination of bulk acoustic wave (BAW) and SAW resonators. Implementations with BAW and SAW resonators can use vertically coupled SAW resonators in combination with additional BAW and/or SAW resonators to complete a filter in accordance with aspects described herein.

The electroacoustic device 100 includes an electrode structure 104, that may be referred to as an interdigital transducer (IDT), on the surface of a piezoelectric layer 102. The electrode structure 104 generally includes first and second electrode structures (e.g., conductive, generally metallic, cone-shaped, etc.) with electrode fingers of IDT 105 extending from two busbars towards each other arranged in an interlocking manner. An electrical signal excited in the electrode structure 104 (e.g., by applying an AC voltage) is transformed into an acoustic wave 106 that propagates in a particular direction via the piezoelectric layer 102. The acoustic wave 106 is transformed back into an electrical signal and provided as an output. In many applications, the piezoelectric material of each layer (e.g., the piezoelectric layer 102) has a particular crystal orientation such that when the electrode structure 104 is arranged relative to the crystal orientation of the piezoelectric layer 102, the acoustic wave mainly propagates in a direction perpendicular to the direction of the fingers (e.g., parallel to the busbars).

FIG. 1B is a diagram of a side view of the electroacoustic device of FIG. 1A, along a cross-section. The electroacoustic device is illustrated with a simplified layer stack including a piezoelectric layer 102 with an electrode structure 104 disposed on or over (a surface of) the piezoelectric layer 102. In some aspects, the electrode structure is disposed over the piezoelectric layer with an intermediate material disposed between the electrode layer and the piezoelectric layer for power, durability, and/or coupling modification (e.g., $Al_2O_3$). In other aspects, other stacks or materials layers can be used as part of a device with a piezoelectric substrate (e.g., including one or more piezoelectric layers) combined with an electrode structure disposed on or over the piezoelectric substrate, with optional additional layers. In some aspects, the electrode structure 104 is conductive and may be formed from metallic materials. The piezoelectric layer may be formed from a variety of piezoelectric materials such as quartz, lithium tantalate ($LiTaO_3$), lithium niobate ($LiNbO_3$), doped variants of these, or other piezoelectric materials. It should be appreciated that more complicated layer stacks (e.g., two or more layers, etc.), including layers of various materials, e.g., different piezoelectric materials, may be possible within the stack. For example, optionally, a temperature compensation layer 108 (denoted by the dashed lines) may be disposed over, (e.g., covering or positioned over), the electrode structure 104. As another example, the piezoelectric layer 102 may be part of a multi-layer substrate that may include another base substrate such as a silicon substrate (e.g., for a thin-film SAW device, the piezoelectric layer may be formed on a temperature compensation layer, a charge trapping layer, a high resistivity layer (e.g., silicon), or other such layer stacks). The piezoelectric layer 102 may be extended with multiple interconnected electrode structures disposed thereon to form a multi-resonator filter or to provide multiple filters. While not illustrated in FIG. 1B, when provided as an integrated circuit component, a cap layer may be provided above the electrode structure 104 (e.g., such as cap 1090 of FIG. 10, cap 1190 of FIG. 11, etc.). The cap layer is applied so that a cavity is formed between the electrode structure 104 and an under surface of the cap layer. Electrical vias or bumps that allow the AW component to be electrically connected to connections on a substrate (e.g., via flip-chip or other techniques) may also be included.

Figure 1C:
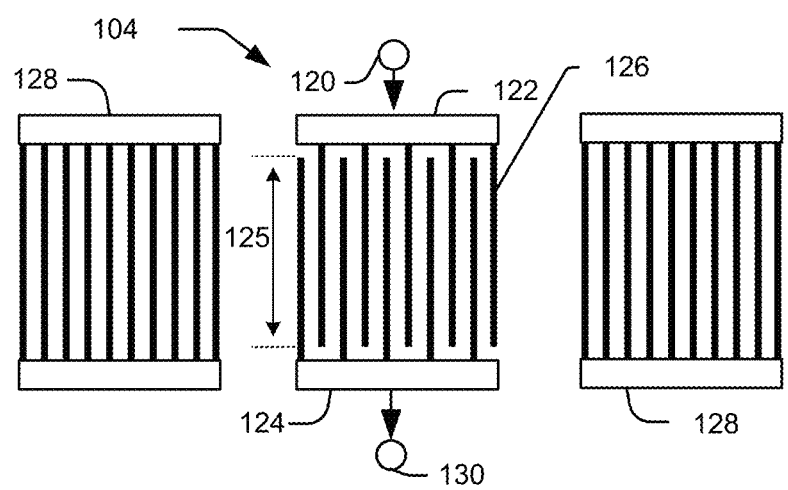
FIG. 1C is a diagram of a top view of an example of an electrode structure of an example electroacoustic device.

FIG. 1C is a diagram of a top view of an example of the electroacoustic device including the electrode structure 104 along with end reflectors. FIG. 1C generally illustrates a two-port configuration of an electroacoustic (e.g., AW) device. The electrode structure 104 has an IDT that includes a first busbar 122 (e.g., first conductive segment or rail) electrically connected to a first terminal 120 and a second busbar 124 (e.g., second conductive segment or rail) spaced from the first busbar 122 and connected to a second terminal 130. A plurality of conductive fingers 126 are connected to either the first busbar 122 or the second busbar 124 in an interdigitated manner. Fingers 126 connected to the first busbar 122 extend towards the second busbar 124 but do not connect to the second busbar 124 so that there is a small gap between the ends of these fingers 126 and the second busbar 124. Likewise, fingers 126 connected to the second busbar 124 extend towards the first busbar 122 but do not connect to the first busbar 122 so that there is a small gap between the ends of these fingers 126 and the first busbar 122.

In the direction along the busbars 122 and 124, there is an overlap region including a central region where a portion of one finger overlaps with a portion of an adjacent finger (as illustrated by the central region 125). The central region 125 including the overlap may be referred to as the aperture, track, or active region where electric fields are produced between fingers 126 to cause an acoustic wave to propagate in the piezoelectric layer 102. The periodicity of the fingers 126 is referred to as the pitch of the IDT. The pitch may be indicted in various ways. For example, in certain aspects, the pitch may correspond to a magnitude of a distance between fingers in the central region 125. The distance may be defined, for example, as the distance between center points of each of the fingers (and may be generally measured between a right (or left) edge of one finger and the corresponding right (or left) edge of an adjacent finger when the fingers have uniform thickness). As described herein, a "higher" pitch refers to sections of an IDT where electrode fingers have greater distances between adjacent electrode fingers, and a "lower" pitch refers to sections of an IDT where electrode fingers have lower distances between adjacent electrode fingers. In certain aspects, an average of distances between adjacent fingers may be used for the pitch. Having sections of an IDT with electrode fingers having a given pitch characteristic different from pitch characteristics of other sections of an IDT allows for selection or control of the signals (e.g., waves) that propagate through the IDT. The frequency at which the piezoelectric material vibrates is a self-resonance (also called a "main-resonance") frequency of the electrode structure 104. The frequency is determined at least in part by the pitch of the IDT 105 and other properties of the electroacoustic device 100.

In some examples, the pitch characteristics of sections of an IDT can be a constant pitch, where the pitch does not vary significantly over the IDT section (e.g., variances are within manufacturing tolerances, and are designed for a constant average pitch). In other examples, pitch characteristics of an IDT section can include a "chirped" pitch, where the pitch varies in a predefined way over the IDT section. For example, a chirped pitch can include an IDT section where the pitch is designed to change linearly across the IDT section, such that the pitch at one end of the IDT section is at a first value, the pitch at an opposite end of the IDT section is at a second, different value, and the pitch (e.g., the distance between electrode fingers) changes linearly between the two ends of the IDT section. In other examples, non-linear variations in pitch value across an IDT section can be used. By combining IDT sections with different pitch characteristics (e.g., a constant pitch at a first value and a constant pitch at a second value, or a constant pitch at a first value in one IDT section and a chirped pitch across a second IDT section), the resonator characteristics can be designed for a given performance in a circuit, with multiple AW resonators able to be combined together to form a filter, as described in FIG. 10 below.

The IDT 105 is arranged between two reflectors 128 which reflect the acoustic wave back towards the IDT 105 for the conversion of the acoustic wave into an electrical signal via the IDT 105 in the configuration shown and to prevent losses (e.g., confine and prevent escaping acoustic waves). Each reflector 128 has two busbars and a grating structure of conductive fingers that each connect to both busbars. The pitch of the reflector may be similar to or the same as the pitch of the IDT (at the respective end of the IDT) 105 to reflect acoustic waves in the resonant frequency range, and many configurations are possible.

When converted back to an electrical signal, the measured admittance or reactance between both terminals (e.g., the first terminal 120 and the second terminal 130) serves as the signal for the electroacoustic device 100, and allows the electroacoustic device 100 to be used in a signal path as part of a communication apparatus.

Additionally, while standard IDT arrangements isolate different IDTs to prevent acoustic waves from outside an individual IDT from having a significant impact on the operation of a given resonator, aspects described herein include configurations where waves can reflect and interact not only within a single IDT (e.g., the IDT 105) of a SAW resonator, but with one or more additional IDTs on an opposite side of a piezoelectric substrate. Such electroacoustic interaction between IDTs can be configured as part of filter characteristics of a filter including vertically coupled IDTs on both sides of the piezoelectric substrate. Such coupling across a piezoelectric substrate can allow complex filter characteristics while shrinking AW structure sizes (e.g., due to less area use and thinner substrates).

Figure 2A:
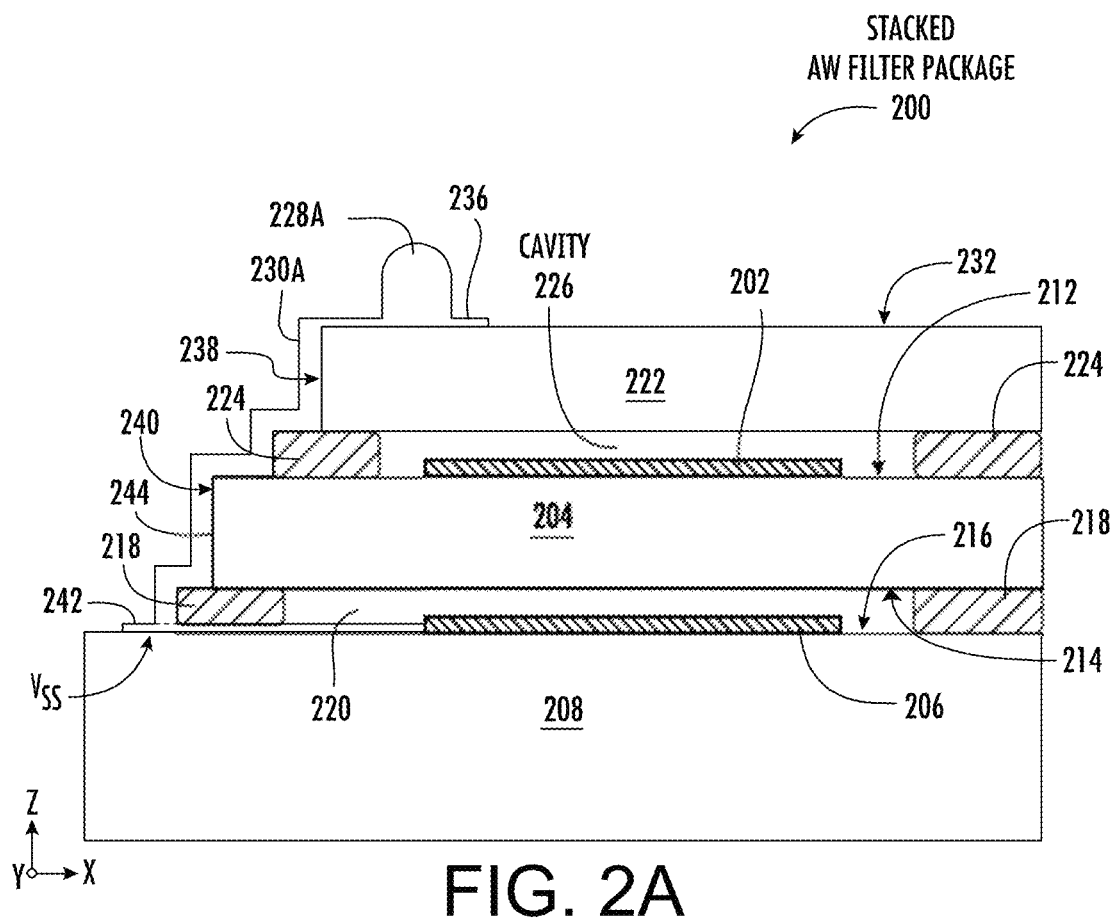
FIG. 2A is an illustration of a side view of a cross-section through a ground pin or a signal pin of some elements of a stacked AW filter package that can be used with vertically coupled resonators in accordance with aspects described herein.
Figure 2B:
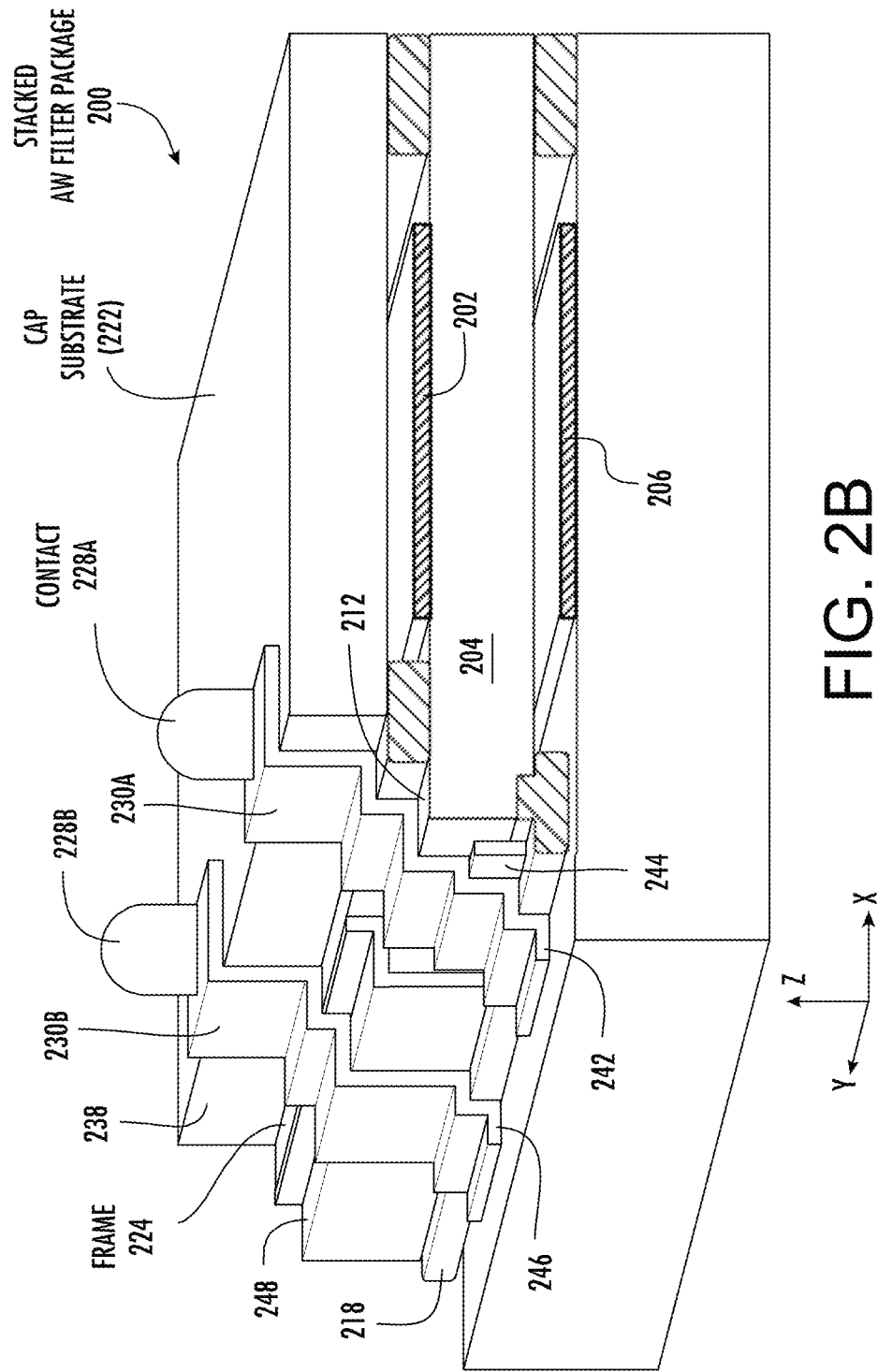
FIG. 2B is a perspective view of portions of an AW filter package that can be used with vertically coupled resonators, in accordance with aspects described herein.

FIG. 2A is an illustration of a cross-sectional side view of a stacked AW filter package 200 that includes a first AW resonator circuit 202 (e.g., a SAW resonator circuit as described above) on a first substrate 204 and a second AW resonator circuit 206 on a second substrate 208 to provide electroacoustic resonators that can be coupled together to form filter circuits. The AW resonator circuits 202 and 206 can include vertically coupled resonators as described herein, and can be implemented with similar fabrication and packaging structures as the stacked AW filter package 200. In some implementations, as will be described below, such AW resonator circuits 202 and 206 can be connected via a redistribution layer and a shared substrate, rather than structured on separate substrates as shown in FIG. 2A. Each of the first substrate 204 and the second substrate 208 may have additional electroacoustic devices (e.g., in addition to AW resonator circuits 202 and 206) similar to the electroacoustic device 100 in FIGS. 1A-C as part of an AW filter circuit. FIG. 2A is a side view of a cross-section of the stacked AW filter package 200 through a ground pad 242. FIG. 2B is a perspective view of a cross-section of the stacked AW filter package 200 through a signal pad 246. In some aspects, the ground pad 242 can be a signal pad and the signal pad 246 can be a ground pad. In further aspects, all combinations of signal/ground pads are possible, and the particular implementation of FIGS. 2A and 2B are illustrative examples of one possible cross section.

In some implementations, the substrates 204 and 208 may include a piezoelectric layer as part of the described substrate. In other implementations, the AW resonator circuits 202 and 206 may include a piezoelectric layer that may or may not be integrated with the corresponding substrates 204 and 208. In some implementations, the first AW resonator circuit 202 and the second AW resonator circuit 206 can each refer to electrode structures of a resonator circuit, where each electrode structure is positioned relative to a piezoelectric layer. The piezoelectric layer may be used as a surface for the electrode structures of the AW resonator circuits 202 and 206, and the piezoelectric layer may, in various aspects, either be part of the AW resonator circuit 202 or 206 or part of the corresponding substrate 204, 208.

As shown in FIG. 2A, the AW filter package 200 includes a first AW resonator circuit 202 on a first substrate 204 and a second AW resonator circuit 206 on a second substrate 208. The first AW resonator circuit 202 is stacked above the second AW resonator circuit 206 in the vertical direction (e.g., the z-axis direction). The first AW resonator circuit 202 and the second AW resonator circuit 206 are referred to herein collectively as "resonator circuits 202, 206". The first AW resonator circuit 202 and the second AW resonator circuit 206 can each correspond to the AW circuits in FIGS. 1A-1C but may also be any other type or configuration of an AW filter circuit (e.g., separate or shared filter structures, such as the filter illustrated in FIG. 10). Therefore, details of the first AW resonator circuit 202 and the second AW resonator circuit 206 (e.g., the particular AW resonator couplings to form a given filter) are not shown in FIG. 2A or 2B. The resonator circuits 202, 206 include first metal interconnects (as discussed above in FIGS. 1A-1C, and illustrated in the vertically coupled packaging of piezoelectric substrates in FIGS. 9-14) for receiving input RF signals from an external circuit (e.g., antenna) and providing filtered RF signals as an output to an external circuit along a signal path that includes filtering provided by the connections of the AW resonators and other circuit elements.

In the AW filter package 200 in FIG. 2A, the first AW resonator circuit 202 is disposed on a first surface 212 of the first substrate 204. For example, the first substrate 204 may be formed of a semiconductor material (e.g., silicon) formed in wafers to take advantage of advances and the low cost of semiconductor processing techniques, with resonators placed on a piezoelectric layer. As mentioned above, the piezoelectric layer may be provided on at least part of the first substrate 204 or as part of the first substrate, (e.g., being provided on or over the semiconductor material.) The second surface 214 is opposite to the first surface 212. With the orientation of the AW filter package 200 shown in FIG. 2A, the first surface 212 can also be referred to as a top surface 212, and the second surface 214 can also be referred to as a bottom surface 214 of the first substrate 204 because the top surface 212 is disposed above the bottom surface 214 in the vertical direction (z-axis direction).

The second AW resonator circuit 206 is disposed on a third surface 216 of the second substrate 208. The first substrate 204 is stacked above the second substrate 208 in the AW filter package 200 to reduce the area occupied by AW filter circuits on the first and second substrates 204, 208. The second substrate 208 (e.g., when a carrier material) may also be formed of a semiconductor material (e.g., silicon) formed in wafers, for example, to take advantage of advances and the low cost of semiconductor processing techniques, with AW resonators placed on a piezoelectric layer as mentioned above. In this regard, the first substrate 204 may be stacked above (e.g., in the vertical, z-axis direction) the second substrate 208, or the second substrate 208 may be stacked below (e.g., in the vertical, z-axis direction) the first substrate 204. A frame 218 is disposed between the second surface 214 of the first substrate 204 and the surface 216 of the second substrate 208. The frame 218 may be polymer support structures configured around the edges of the substrates 204 and 208, with the frame creating a cavity 220 where AW resonators and other circuitry are positioned. The polymer elements are structured to prevent the AW resonator circuits or other elements in the cavity (e.g., the AW resonator circuit 206) from coming into contact with the substrate at the top of the corresponding cavity. The frame 218 can both provide mechanical support for the relative positioning of the first substrate 204 and the second substrate 208, and provide structural protection for elements (e.g., the AV resonators) within the cavity 220. The second AW resonator circuit 206 is disposed in the cavity 220 between the bottom surface 214 of the first substrate 204 and the top surface 216 of the second substrate 208. The cavity 220 may also include air or gas.

The AW filter package 200 in FIG. 2A also includes a cap substrate 222 disposed above the first surface 212 of the first substrate 204. The cap substrate 222 is separated from the first surface 212 by a frame 224 to form a cavity 226 in which the first AW resonator circuit 202 is disposed. The cap substrate 222 provides a cap to the cavity 226 in the manner that the first substrate 204 provides a cap to the cavity 220. The cavity 226 also includes air or another gas around the first AW resonator circuit 202. The cap substrate 222 may be glass, for example, or another non-conductive substrate material. The stacked AW filter package 200 also includes contacts 228A, 228B (e.g., shown in FIG. 2B), which are disposed on metal interconnects 230A, 230B on a contact surface 232 of the cap substrate 222 for connecting the second AW resonator circuit 206 to external circuits. The contacts 228A, 228B are coupled to the second AW resonator circuit 206 by the metal interconnects 230A, 230B formed in a metallization (redistribution) layer 236. The metallization layer 236 extends from the contact surface 232 onto a side surface 238 of the cap substrate 222 and onto a side surface 240 of the first substrate 204. The side surface 240 extends between the first surface 212 and the second surface 214 of the first substrate 204. Additional contacts (not shown) may be disposed on the contact surface 232 for connecting the first AW resonator circuit 202 to external circuits (e.g., processing circuitry, antennas, etc.).

In the stacked AW filter package 200 in FIG. 2A, the first AW resonator circuit 202 may filter a first RF signal while the second AW resonator circuit 206 filters another RF signal. In other aspects, the first AW resonator circuit 202 and the second AW resonator circuit 206 may filter the same signal (e.g., with resonators in the same ladder network). Additionally, as described above, each AW resonator circuit 202, 206 may include one or more resonators connected in one or more filter circuits depending on a device configuration to filter RF signals in a communication apparatus. In some examples, the resonator circuits 202, 206 are not electrically associated with each other in operation, but in other examples, the resonator circuits 202, 206 may both be coupled to a same antenna, not shown, coupled to the AW filter package 200. Thus, the resonator circuits 202, 206 may provide different filters for a same RF signal or may filter different RF signals. In various implementations, the resonators circuits of FIGS. 2A, 2B, and 3 can be implemented with piezoelectric substrates having vertically coupled resonators as described below.

FIG. 2B is a perspective view of the AW filter package 200 shown in FIG. 2A. FIG. 2B is provided to more clearly illustrate certain aspects of the AW filter package 200, in particular, the conductive (e.g., metal) interconnects 230A, 230B on the side surface 240 of the first substrate 204. As shown in this non-limiting example, the metal interconnect 230A extends from the contact 228A and is disposed on the side surface 238 of the cap substrate 222, onto the frame 224, onto the first surface 212 of the first substrate 204, and can be coupled to a portion 244 of a signal path used to create filters with the AW resonators (e.g., the resonator circuits 202, 206). The metal interconnect 230A couples a ground or a portion of the signal path to a corresponding element of a circuit (e.g., the second AW resonator circuit 206 to the contact 228A). For example, the contact 228A may receive a supply of the ground voltage Vss from an external circuit in a mobile device. The metal interconnect 230B extends from the contact 228B and is disposed on the side surface 238 of the cap substrate 222, the frame 224, the insulation layer 248, the frame 218, and the signal pad 246. The metal interconnect 230B couples the signal pad 246 of the AW resonator circuit 206 to the contact 228B, which may be coupled to at least one of the first AW resonator circuit 202 and an external circuit.

Figure 3:
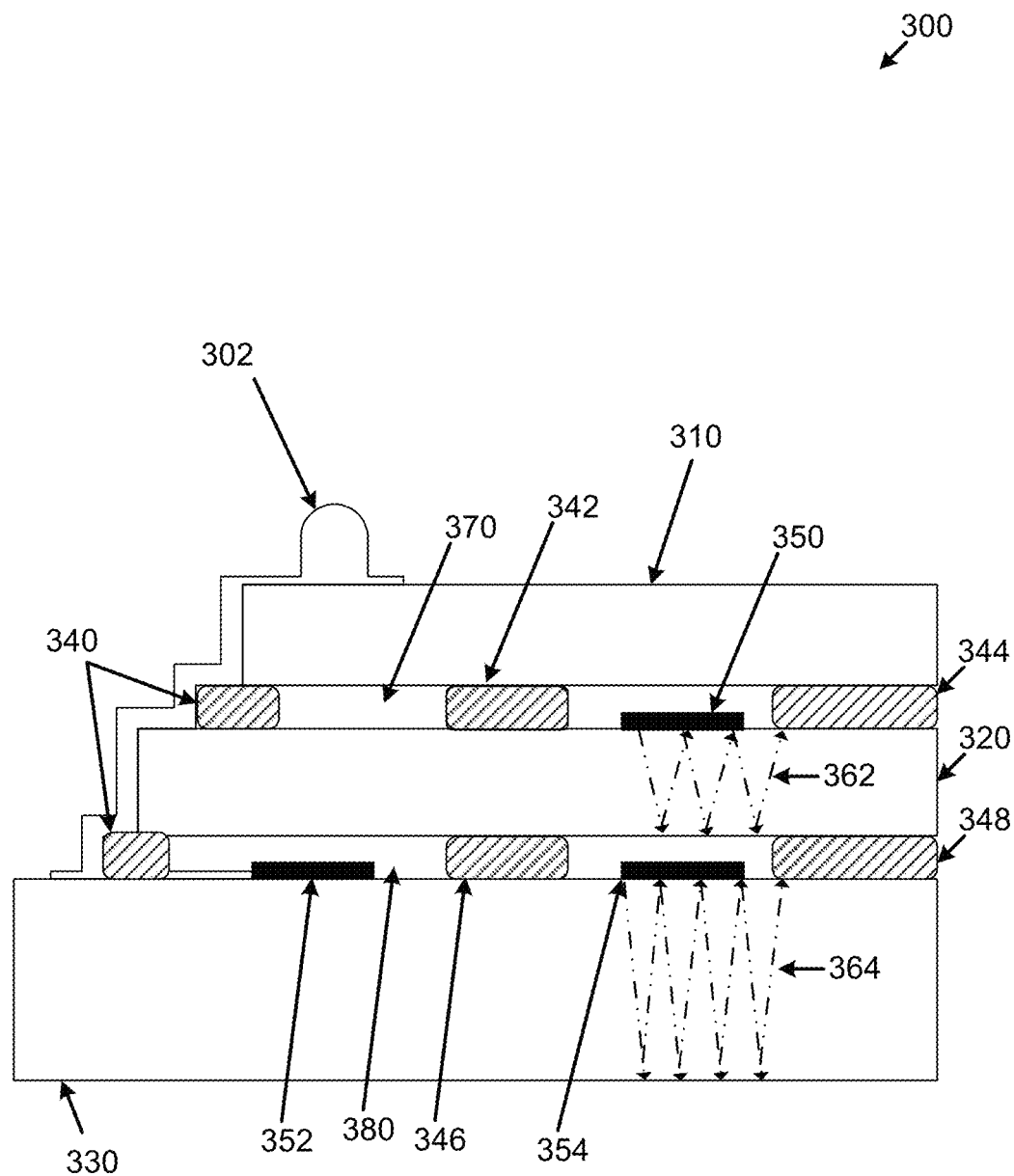
FIG. 3 is a cross-section side view of some elements of an AW filter package illustrating vertical waves that can occur with resonators in an AW filter package in accordance with aspects described herein.

FIG. 3 is a cross-section side view of some elements of a stacked AW filter package 300 illustrating vertical waves (e.g., wave components 362 and 364) that can occur as part of SAW resonator operation. The cross-section of FIG. 3 illustrates an edge portion of the stacked AW filter package 300 on the left, and a central portion on the right that can continue with additional AW resonator circuits and walls. While an upper cavity 370 is shown as only having a single AW resonator circuit 350, and a lower cavity 380 is shown as having two AW resonator circuits 352 and 354, the complete layer stack which is not shown can have additional AW resonator circuits at different positions that are not shown (e.g., either at different depth slices, or further along the slice to the right in a section of the stacked AW filter package 300 that is not shown.) As indicated above, the AW resonator circuits 350, 352, and 354 include electrode structures like those described in FIGS. 1A, 1B, and IC. In various implementations, the AW resonator circuits 350, 352, and 354 may either include a piezoelectric layer that the corresponding electrode structures are positioned on, or the electrode structures may be positioned on a piezoelectric layer that is part of the corresponding substrate for each AW resonator circuit 350, 352, 354 (e.g., the substrates 320 and 330).

The stacked AW filter package may further include contact 302, protective cap 310, and spacers 340, 342, 344, 346, and 348 that can provide mechanical support for the substrates as well as dampening of vertical waves outside of a resonator circuit.

The illustrated structures implementing surface acoustic wave (SAW) filters include wave modes which are concentrated at the surface of the piezoelectric substrate as described above with respect to FIGS. 1A-IC. Such resonators also include vertical wave propagation outside of the surface region of the piezoelectric substrate. Such waves can propagate into the bulk of the piezoelectric material and the substrate supporting the illustrated resonator elements (e.g., acoustic signals entering a substrate from a resonator element such as the IDT, etc.) Propagation into the substrate can be a parasitic effect which deteriorates the overall filter performance (e.g., by increased losses in carrier aggregation counter bands, higher signal leakage, etc.) If the AW resonator circuits 350, 352, and 354 include IDTs only on a top surface, with a bottom surface coupled directly to a substrate (e.g., a silicon substrate such as the first substrate 320 or the second substrate 330), vertical wave components 362 and 364 can be launched into the silicon substrate. Aspects described herein, however, can include AW resonator circuits 350, 352, and 354 configured with IDTs and associated resonators on both sides (e.g., top and bottom) of each AW resonator circuit. Rather than the vertical waves becoming noise as possible bulk radiating waves that reflect off surfaces of the silicon substrate, the vertical waves can be part of a vertical coupling characteristics designed between resonators that is integrated into filter(s) designed with resonators of the AW resonator circuits. Any leakage of such waves can be addressed with dampening materials or other aspects of AW filter design.

Figure 4A:
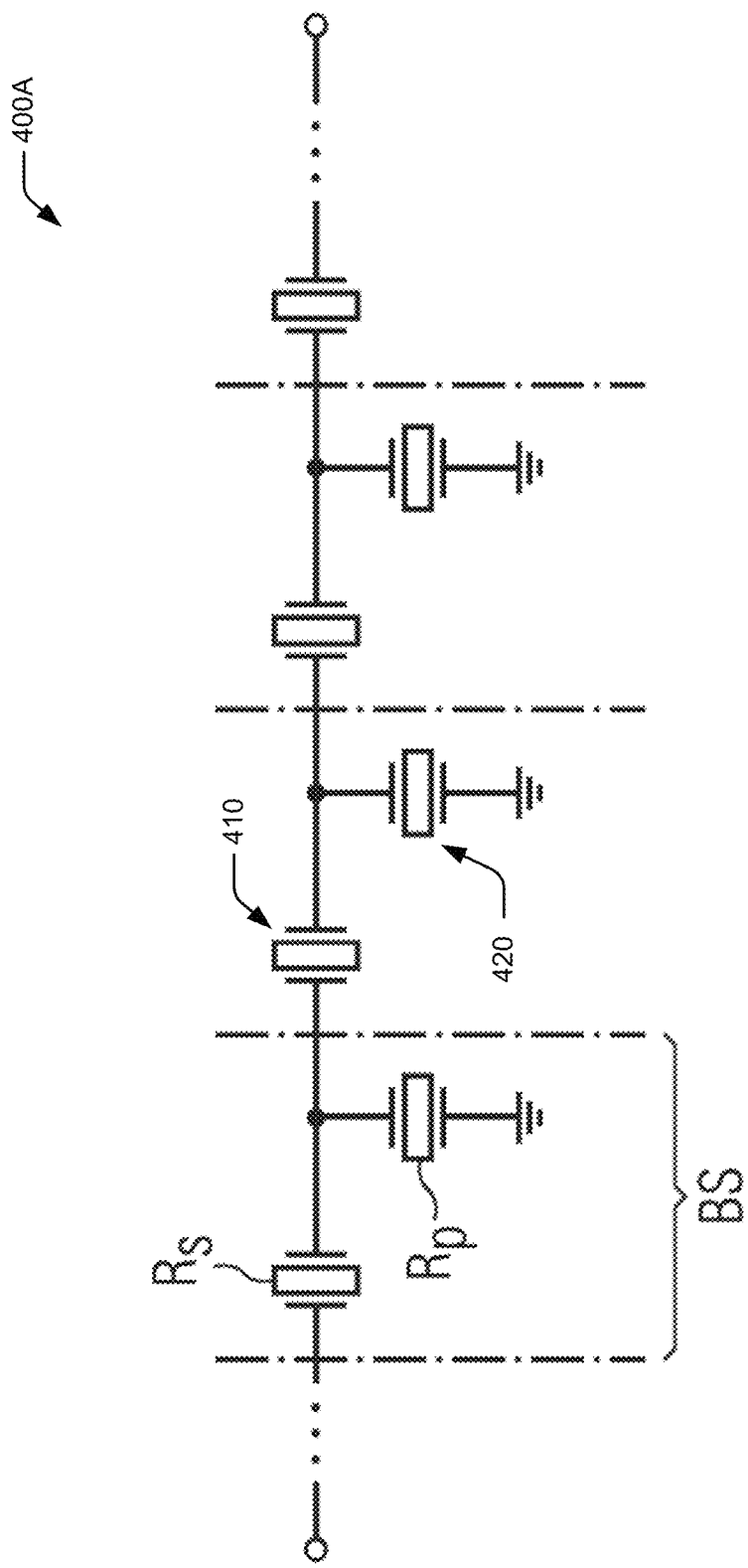
FIG. 4A is a schematic representation of a filter that may be implemented using vertically coupled resonators in accordance with aspects described herein.

FIG. 4A is a schematic representation 400A of a filter that may employ the disclosed vertically coupled resonators, in accordance with examples described herein. In particular, the filter comprises a ladder-type arrangement of acoustic SAW resonators Rs, Rp (where Rs are series resonators and Rp are parallel resonators). The disclosed stacked AW filter may couple SAW resonators (e.g., 410, 420, etc.) to implement the filter while including the described elements for vertical coupling across a piezoelectric substrate used to implement the filter.

The ladder-type structure of the filter comprises a plurality of basic sections BS. Each basic section BS comprises at least one series resonator Rs and at least one parallel resonator Rp. The basic sections BS may be connected together in series in a number of basic sections BS that is necessary to achieve a desired selectivity. Series resonators Rs that belong to neighbored basic sections BS may be combined to a common series resonator Rs, and parallel resonators Rp may also be combined if they are directly neighbored and belonging to different basic sections BS. One basic section BS provides a basic filter. More basic sections BS are added to provide for sufficient selectivity. The filter of FIG. 4A includes at least one illustrated basic section that includes a series resonator 410 and a parallel resonator 420. As described herein, the series resonator 410 and the parallel resonator 420 can be implemented as vertically coupled resonators on opposite sides of a shared piezoelectric substrate.

Figure 4B:
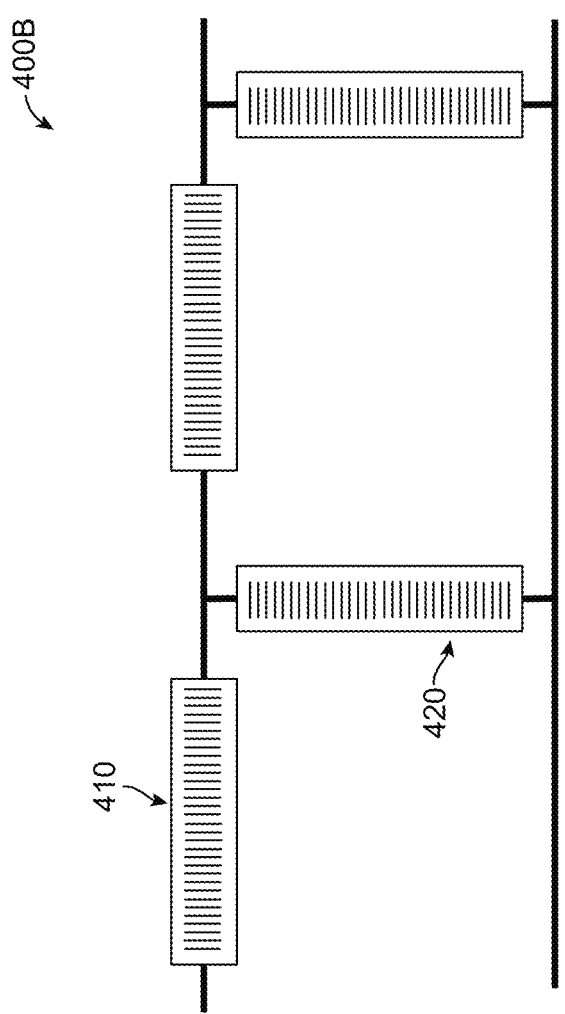
FIG. 4B is a hybrid representation of electroacoustic resonators that can be vertically coupled and used in a filter in accordance with aspects described herein.

FIG. 4B is a hybrid representation 400B of electroacoustic resonators that can be vertically coupled and used in a filter in accordance with aspects described herein. As illustrated in the hybrid representation 400B of the filter, each basic section includes IDTs made up of electrode fingers as described above. In prior systems, each of such IDTs for a SAW resonator is configured on a top surface of a piezoelectric layer and/or positioned to keep acoustic wave interactions between such IDTs at a level where the coupling between IDTs does not impact the performance of the filter. For example, the resonator 410 and the resonator 420 (e.g., each comprising an IDT made up of electrode fingers formed on a surface of a piezoelectric layer) would previously be positioned to limit coupling between the resonator 410 and the resonator 420. In aspects described herein, the resonator 410 and the resonator 420 may be positioned on opposite sides of a piezoelectric substrate and electrically coupled to be part of a single filter. In some implementations, basic sections of a ladder filter may be positioned for coupling between different resonators. In other implementations, coupling can be configured between resonators in different sections, or complex coupling between more than two resonators can be configured to achieve a desired response characteristic for a given filter.

Figure 5A:
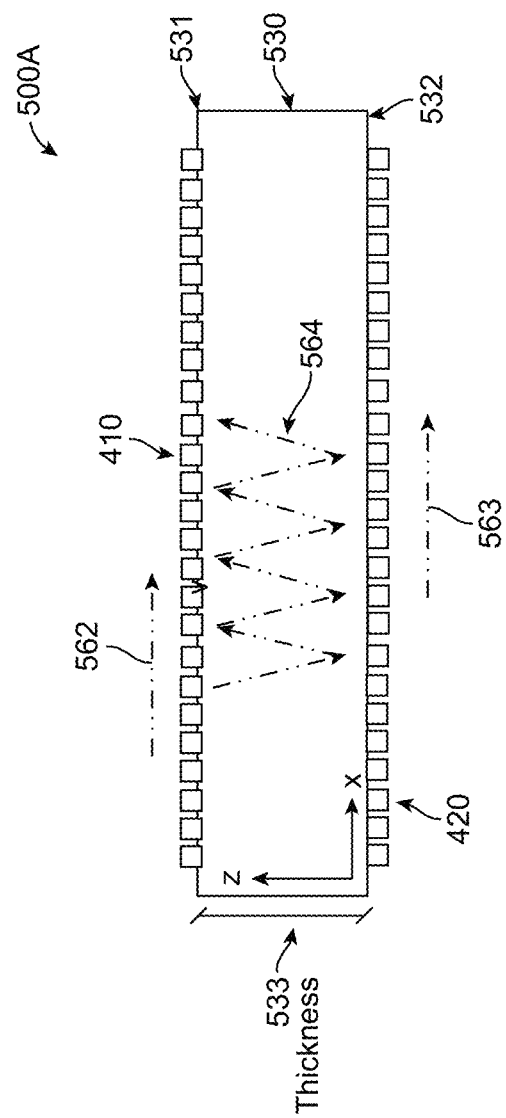
FIG. 5A is a cross-section side view of a piezoelectric substrate having vertically coupled resonators in accordance with aspects described herein.

FIG. 5A is a cross-section side view 500A of a device having vertically coupled resonators in accordance with aspects described herein. The device includes a piezoelectric substrate 530, (e.g., a single piezoelectric layer), the resonator 410 (formed from an IDT and corresponding piezoelectric substrate 530), and the resonator 420 (e.g., with cross-section cut views of the electrode fingers of the IDTs for the resonators 410 and 420 shown). The piezoelectric substrate 530 has a top surface 531, with the IDT of the resonator 410 formed on or over the top surface 531 of the piezoelectric substrate 530. Similarly, the piezoelectric substrate 530 also has a bottom surface 532, with the IDT of the resonator 420 formed on or over (e.g., relative to a center of the piezoelectric substrate) the bottom surface 532. As described herein, an IDT can be referred to as disposed or formed over a piezoelectric surface relative to a central portion of the piezoelectric layer or substrate, such that the IDT of the resonator 410 and the IDT of the resonator 420 can both be referred to as being disposed or formed over the relevant piezoelectric surface relative to the center of the piezoelectric substrate 530. Similar IDT and piezoelectric positioning can be referred to as the IDT being formed on, over, or above a piezoelectric surface relative to the body or core of the piezoelectric layer that has the piezoelectric surface. Such positioning can include disposition of an IDT with an intervening layer between the IDT and the piezoelectric surface in accordance with any aspect described herein.

Figure 5B:
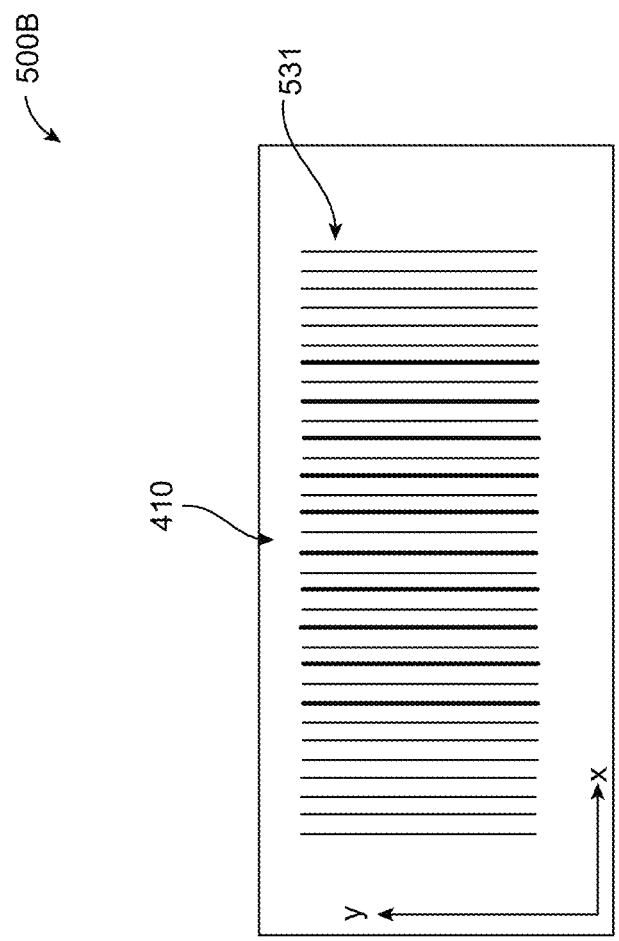
FIG. 5B is a top down view of a piezoelectric substrate having vertically coupled resonators in accordance with aspects described herein.

FIG. 5B is a top down view 500B of the device having vertically coupled resonators in accordance with aspects described herein. The top down view 500B shows the top surface 531 of the substrate 530, along with the resonator 410. The resonator 420 is on the bottom side of the device, and not visible from the top down view 500B.

The illustrated signal 562 of FIG. 5A is the surface signal of the resonator 410, which is the primary signal path of excited waves in a SAW resonator. The illustrated signal 563 is the surface signal of the resonator 420. In case of surface-bound acoustic waves, these waves decay exponentially into the substrate, so that in case of a thick piezoelectric substrate 530 (e.g. thickness 533 approximately 10 lambda or greater, or greater than 20 times a minimum of a pitch of a first IDT and a pitch of the second IDT), no significant portion of the signal 562 can be detected by resonator 420. For a thin piezoelectric substrate 530, however, or for leaky acoustic waves, part of the signal 562 can be detected by resonator 420 and generates an electrical output signal at resonator 420. Thus, resonator 420 is coupled to resonator 410 via the acoustic wave linked to surface signal 562. Similarly, the surface signal 563 can mediate a coupling between resonator 410 and resonator 420, if the piezoelectric substrate is sufficiently thin.

In addition, coupling between resonators 410 and 420 can be generated by acoustic waves of signal paths 564 propagating in vertical or diagonal direction. Such waves may be excited by resonator 410 and detected by resonator 420, so that an electrical input signal at resonator 410 leads to an electrical output signal at resonator 420 and vice versa. The amount of coupling between resonators 410 and 420 depends on the thickness of the piezoelectric substrate, on the polarization of the acoustic waves linked to surface signal 562 and 563, the design of the resonators 410 and 420, the horizontal offset between the resonators and other geometry parameters.

When the electroacoustic coupling between the resonators 410 and 420 is included as a design consideration for a filter including the resonators 410 and 420, complex filter responses can be generated while shrinking the size of the filter. In some implementations, the efficiency of a device can be improved, since the energy in the signal paths 564 is used and directed as part of a filter output, rather than being dissipated.

In some systems, the resonators are manufactured under an assumption that the wave fields excited by inputs to a resonator are decoupled. In aspects described herein, such an assumption is not valid, as the interaction between the excited wave fields (e.g., the coupling between resonators) is sufficient to impact performance. In a model of two IDTs (e.g., IDTs of the resonators 410 and 420), the frequency dependent wave excitation fields can be described as $\psi(\underline{x}, f)_{IDT\ 1}$ and $\psi(\underline{x}, f)_{IDT\ 2}$ respectively where x denotes the position vector and f denotes the frequency. For decoupled systems, because $\psi(\underline{x}, f)_{IDT\ 1}$ and $\psi(\underline{x}, f)^{IDT\ 2}$ are assumed to be 0 or close to 0 when the other is not close to zero, the total wave excitation field around the resonators can be approximated as $$\psi_{tot} = \psi_{IDT1} + \psi_{IDT2}. \tag{1}$$

For a coupled system, however, this assumption is no longer valid, but the total wave excitation field becomes a combination which is not a simple superposition of the wave fields (due to non-linear effects) and which can be described as:

$$\psi_{tot} = \psi_{IDT1+IDT2} \tag{2}$$

This combined wave field for coupled IDTs (e.g., in vertically coupled resonators), while having a more complex filter function, can provide filtering for some applications while allowing for design flexibility with reduced space usage and compact interconnections between resonators. Additionally, while equation 2 above describes the situation with two IDTs that are coupled, as described below, the same complex combination can apply to more than two IDTs and more than two resonators that are positioned with vertical or other complex coupling.

In some aspects described herein, $\psi(\underline{x}, f)_{IDT\ 2}$ is generated by the electrical input signal connected to a first IDT (e.g., the IDT of resonator 410), and $\psi(\underline{x}, f)_{IDT\ 2}$ is generated by the electrical input signal connected to into a second IDT (e.g., the IDT of the resonator 420). A non-vanishing field $\psi(\underline{x}, f)_{IDT\ 1}$ causes an output signal at the first IDT, and a non-vanishing field $\psi(\underline{x}, f)_{IDT\ 2}$ causes an output signal at the second IDT.

In case of uncoupled IDTs (e.g., the IDTs of resonators 410 and 420), the field $\psi(\underline{x}, f)_{IDT\ 1}$ is 0 or close to 0 in the vicinity of the second IDT, so that any input signal fed into the first IDT does not cause significant output signal at the second IDT. Thus, the output signal of the second IDT is independent of the input at the first IDT, and vice versa. Moreover the output signal of the second IDT does not depend on the geometry, electrode structure, excitation state or very basic even the existence of the first IDT.

For coupled IDTs, however, both fields $\psi(\underline{x}, f)_{IDT\ 1}$ and $\psi(\underline{x}, f)_{IDT\ 2}$ cover both IDTs. Therefore, any input signal at the first IDT causes an output at the second IDT and vice versa. Consequently, the output of the second IDT depends on both the input signal at the second IDT and the input signal at the first IDT.

In such a coupled system, we can define a coupling factor as the magnitude of the field $\psi(\underline{x}, f)_{IDT\ 1}$ at the location of the second IDT over the magnitude of the field $\psi(\underline{x}, f)_{IDT\ 1}$ at the location of the first IDT. Similarly, the coupling factor may be defined as the magnitude of the field $\psi(\underline{x}, f)_{IDT\ 2}$ at the location of the first IDT over the magnitude of the field $\psi(\underline{x}, f)_{IDT\ 2}$ at the location of the first IDT. Alternatively, we can define a coupling factor as the ratio of the output signal at the second IDT over the output signal at the first IDT for a given input signal at the first IDT or the second IDT.

The spatial superposition of electroacoustic wave fields for coupled IDTs (e.g., in vertically coupled resonators) can provide more complex transmission functions and filtering for some applications while allowing for design flexibility with reduced space usage and compact interconnections between resonators. Additionally, while the previous paragraph describes the situation with two coupled IDT, as described below, the same complex combination can apply to more than two IDTs and more than two resonators that are positioned with vertical or other complex coupling.

Figure 6A:
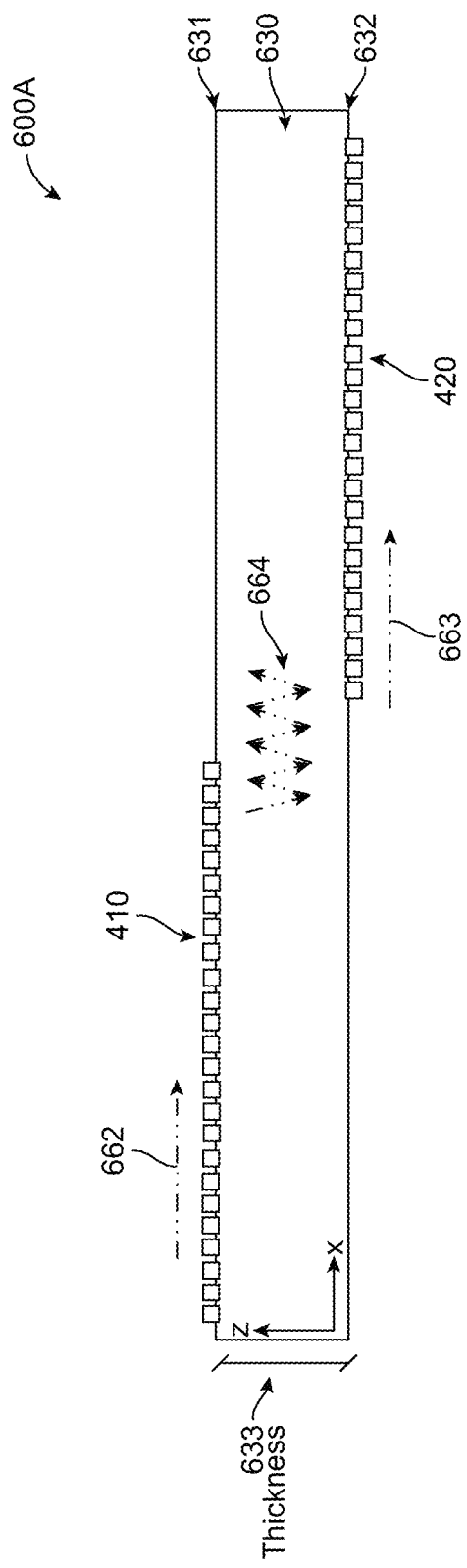
FIG. 6A is a cross-section side view of a piezoelectric substrate having vertically coupled resonators in accordance with aspects described herein.
Figure 6B:
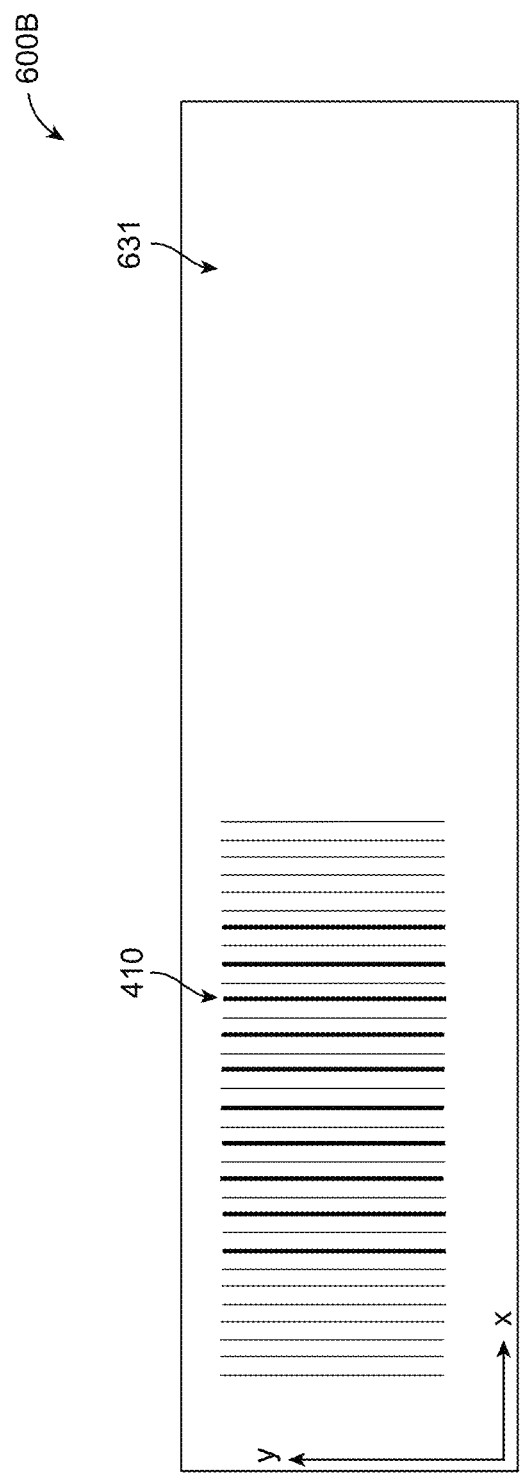
FIG. 6B is a top down view of a piezoelectric substrate having vertically coupled resonators in accordance with aspects described herein.

FIG. 6A is a cross-section side view 600A of a device having vertically coupled resonators in accordance with aspects described herein. FIG. 6B is a top down view 600B of the device. Similar to the device in FIGS. 5A and 5B, the device in FIGS. 6A and 6B includes a piezoelectric substrate 630 having a top surface 631 and a bottom surface 632. In the illustrated implementation of the device, the resonator 410 is provided on the top surface 631, and the resonator 420 is provided on (under) the bottom surface 632, but in the device in FIGS. 6A and 6B, a position of the resonator 410 on the top surface 631 is offset (in a direction of signal propagation) from a position of the resonator 420 on the bottom surface 632. In the top down view 500B of the device in FIG. 5B that shows the resonator 410 on the top surface 531, the resonator 420 would be directly below the resonator 410 on the corresponding opposite surface of the piezoelectric substrate 530. By contrast in the top down view 600B, additional surface area is present since there is no vertical overlap between the resonator 410 and the resonator 420.

The cross-section side view 600A, in addition to illustrating the piezoelectric substrate 630, also illustrates a thickness 633 of the piezoelectric substrate 630, and the offset (e.g., in the labeled x-direction) between the resonator 410 and the resonator 420. Just as in the device in FIGS. 5A and 5B, the resonator 410 and the resonator 420 have associated signal paths. The resonator 410 is associated with the signal 662, and the resonator 420 is associated with the signal 663. Just as with the device in FIGS. 5A and 5B, the signals 662 and 663 are based on the coupling between the resonators 410, 420 within a filter structure, which can include not only the resonator response to a signal for the individual IDTs, but also the impact of electroacoustic coupling across the piezoelectric substrate 630 (e.g., illustrated as signal paths 664). In other aspects with other configurations of substrate layers and thicknesses and different placement and overlap of resonator IDT structures, other signals can be present. The vertical (e.g., the labeled z-direction) coupling between the resonators 410 and 420 additionally results in the signal paths 664. Due to the lack of vertical direction overlap, the coupling between the resonators 410 and 420 is lower, and the strength of the signal in the signal paths 664 will be less than the strength of the signal in the signal paths 564. Thus, in addition to configuring the coupling of resonators based on the thickness of a piezoelectric substrate (e.g., the thickness 633 or the thickness 533), an amount of coupling between resonators can be adjusted in a design configuration based on an amount of vertical overlap between IDTs of resonators on opposite sides of a piezoelectric substrate. Shifting the resonator 420 to the left (e.g., in the negative x-direction) along the second surface 632 would result in increased coupling between the resonators 410 and 420, while shifting the resonators away from each other (e.g., shifting resonator 410) to the left or resonator 420 to the right in the cross-section side view 600A) would result in lower coupling, and weakening of the signal in signal paths 664 in operation of the device. Such configurations as described herein can be used to change the combined interaction between the fields of coupled resonators (e.g., a value of equation 2), adjust filter response characteristics, and set the performance characteristics of a filter using not only the resonance characteristics of individual resonators, but also the coupling between resonators.

The coupling between resonators on opposite sides of a piezoelectric substrate is not a simple characteristic based only on the thickness, but will also vary with the pitch of the electrode fingers in IDTs of the resonators. As described above, the frequencies present in a SAW resonator are based on a pitch of the electrode fingers, and similarly, coupling between resonators on opposite sides of a piezoelectric substrate will depend on the pitch of the fingers. In operation, a wavelength for a resonator can be considered twice the spacing between the electrode fingers (e.g., 2*pitch, where the pitch is the spacing between the fingers). In some aspects with a single layer piezoelectric substrate (as, for instance, shown in FIG. 5A), a coupling between resonators can provide beneficial performance characteristics with efficient coupling when the thickness of the piezoelectric substrate (e.g., the thickness 533 or 633) is between 0.2 and 1 times the resonant wavelength (e.g., between 0.4 and 2 times the distance between electrode fingers of the IDT). In some aspects, the coupling occurs when the thickness is less than 20 times a minimum of a pitch of the IDTs on opposite surfaces of a piezoelectric layer or a piezoelectric substrate. In other aspects that can operate with vertical coupling that can involve additional distortion of signals, the thickness of the piezoelectric substrate is between 0.05 and 10 times the value of the wavelength (e.g., greater than 0.1 times the minimum of the pitch of a first IDT and a pitch of a second IDT, or less than 20 times the distance between the electrode fingers of the IDTs). In some aspects, the thickness of the piezoelectric layer is between 0.4 times a minimum of a pitch of a first IDT and a pitch of a second IDT and two times a minimum of the pitch of the first IDT and the pitch of the second IDT.

FIGS. 5A, 5B compared with FIGS. 6A, 6B describe different design offsets between IDTs on top and bottom piezoelectric surfaces of a single piezoelectric layer. For example, in FIGS. 6A and 6B, a device is described where a projection of the resonator 410 onto the second piezoelectric surface in a perpendicular direction from the first piezoelectric surface does not overlap with the resonator 420. Such an offset can limit or reduce electroacoustic resonance across a piezoelectric layer between IDTs on a top surface and IDTs on a bottom surface.

By contrast, FIGS. 5A and 5B describe structures where the resonator 410 and the resonator 420 overlap in a vertical direction such that a vertical projection across the piezoelectric substrate of an area on the first piezoelectric surface that includes the first resonator 410 (e.g., a top IDT) overlaps with an area on the second piezoelectric surface that includes the resonator 420 (e.g., a second IDT.)

In addition to these structures, intermediate overlapping structures can be used to tune the electroacoustic coupling across a piezoelectric layer. For example, rather than exactly overlapping as in FIGS. 5A and 5B, or not overlapping at all as in FIGS. 6A and 6B, a structure with a partial vertical overlap can be used. Such a structure can be created where the resonator 410 and the resonator 420 partially overlap in a vertical direction such that at least a threshold portion of a vertical projection across the piezoelectric substrate of the resonator 410 (e.g., a first IDT) overlaps with an area on the second piezoelectric surface that does not include the resonator 420 (e.g., a second IDT.) Any level of overlap can be used in different aspects, such as IDTs with a threshold amount of overlap in a vertical direction (e.g., 25 percent, 50 percent, 75 percent, or any other threshold overlap or overlap targeted to achieve a given electroacoustic coupling characteristic for a filter performance characteristic).

Figure 7:
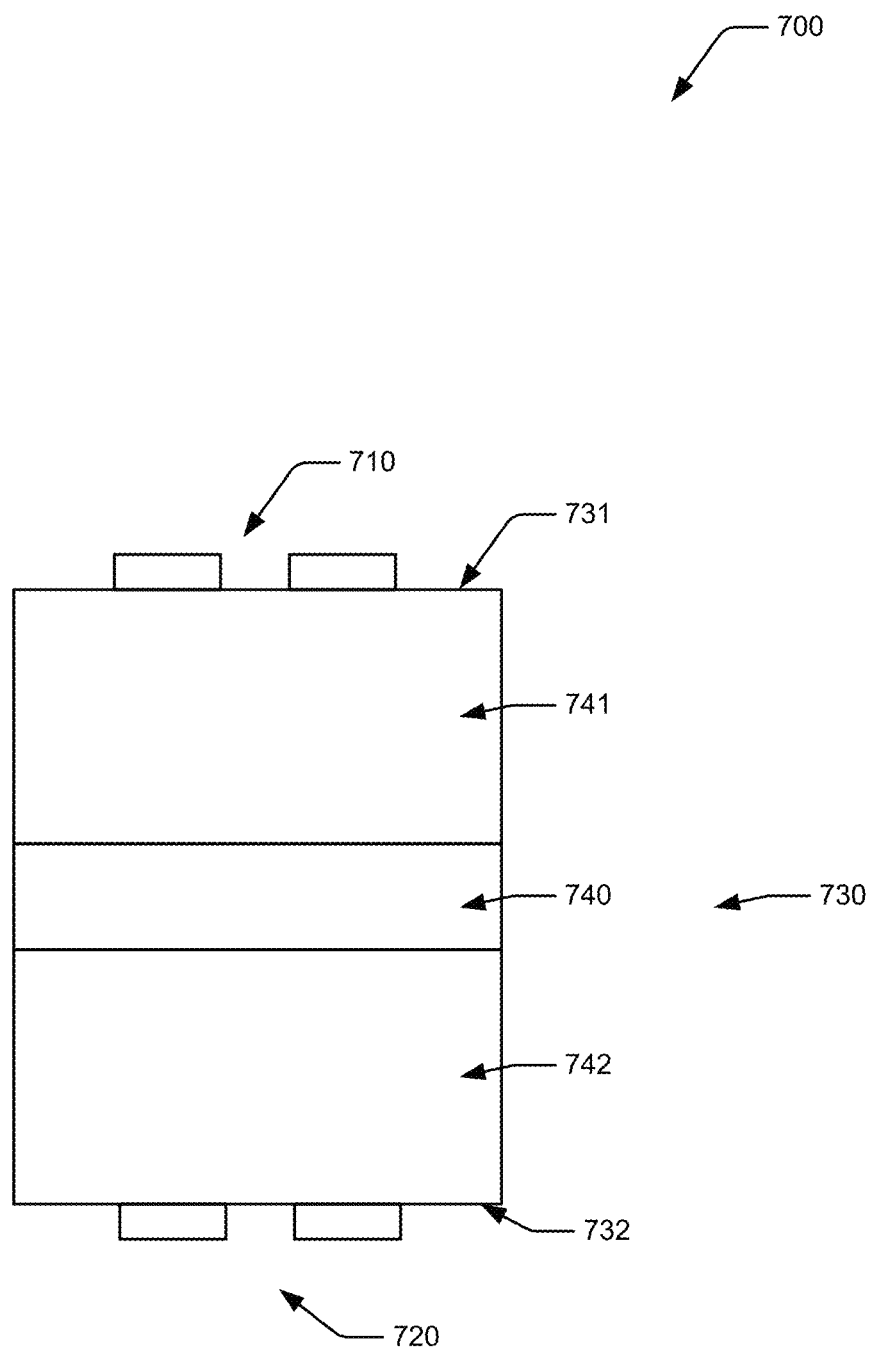
FIG. 7 is a cross-section side view of a piezoelectric substrate with multiple piezoelectric layers and a spacing layer having vertically coupled resonators in accordance with aspects described herein.

FIG. 7 is a cross-section side view 700 of a piezoelectric substrate 730 with two piezoelectric layers 741 and 742 and a spacing layer 740 having vertically coupled resonators 710 and 720 in accordance with aspects described herein. Where the devices of FIGS. 5A, 5B, 6A, and 6B include a simple piezoelectric substrate with a single layer of piezoelectric material, some aspects can include a more complex piezoelectric substrate. As illustrated, the piezoelectric substrate 730 includes a first piezoelectric layer 741 which comprises the top surface 731 of the piezoelectric substrate, and a second piezoelectric layer 742 that comprises the bottom surface 732 of the piezoelectric substrate. The first piezoelectric layer 741 and the second piezoelectric layer 742 are separated by a spacer layer 740. In some implementations, the spacer layer 740 can be a dielectric material. In some implementations, the spacer layer 740 can facilitate fabrication by allowing independent fabrication of the resonators 710 and 720 on separate piezoelectric layers 741 and 742, where the layers can then be bonded together using the spacer layer 740. In some aspects, Ta2O5, HfO2, Al2O3, WO3, Nb2O5, SiOx, Polymer, PSN and other oxides and nitrides (e.g., AlN) can be used. In some implementations, the piezoelectric layers 741 and 742 are made from the same piezoelectric material. In other implementations, the piezoelectric layers 741 and 742 are made from different piezoelectric materials. Using piezoelectric layers 741 and 742 made from different piezoelectric materials provides further flexibility when designing the characteristics of the two (coupled) resonators 710 and 720. In various aspects, numerous crystal orientations where the main mode is more concentrated at the top of the piezoelectric layer may be used (e.g., LN128 among many others). In some aspects, cuts or piezoelectric material orientations can be used that that will provide stronger radiating towards the bulk already for the main mode (such as a LT42 with LithiumThantalate). In some aspects, a mix of different cuts of LT (e.g. LT42 and LT36), as well as LT and LN, LT and doped LT, and so on may be used. In some aspects doping can be used to improve coupling, temperature behavior etc. while maintaining the polarization of the acoustic mode(s). In some aspects different LT layers can be mixed with different dopings or without doping.

In addition, the spacer layer 740 can modify the coupling beyond the coupling determined by the thickness of the piezoelectric substrate 730. As discussed above, a thickness of the piezoelectric substrate 730 that is associated with a vertical distance between the resonator 710) and the resonator 720 impacts the coupling between the resonators 710 and 720. The presence of the spacer layer 740 which is a different material than the piezoelectric material in piezoelectric layers 741, 742 can additionally impact the coupling. In particular, the thickness of the spacer layer 740 can, in some implementations, be increased while shrinking a thickness of the piezoelectric layers 741, 742 to modify coupling between resonators on different parts of a device while maintaining a uniform piezoelectric substrate thickness, when different coupling characteristics are desired. This coupling adjustment from the thickness of the spacer layer 740 is in addition to adjustments that can be made to coupling based on positioning offsets as discussed above.

Further, in some implementations, the spacer layer 740 can act as a waveguide to further create complex coupling of wave modes between resonators, depending on the material and geometry of the spacer layer. Some such structures can result in plate modes that allow resonators to exchange energy with opportunities to form passbands with increased bandwidths for a given space usage. Aspects of such configurations can be used to control the wave modes and specifics of coupling interactions between resonators in some aspects to provide improved filter response curves. In some aspects, a thickness of the spacer layer 740 is between 0.05 and 5 times the resonant wavelength of resonators 710 and 720 (e.g., assuming equal pitch and piezoelectric material). In some aspects, a thickness of the spacer layer 740 is between 0.1 and 0.6 times the resonant wavelength to allow for the formation of plate modes. In some aspects, a thickness of the spacer layer 740 is less than 10 times the minimum of the pitch of the IDTs coupled across a piezoelectric substrate. In some aspects, a thickness of the spacer layer 740 is greater than 10 times a maximum of the pitch of the IDTs. In some aspects, a thickness of the spacer layer 740 is less than 1.2 times a minimum of a pitch of the first IDT and a pitch of the second IDT.

In some aspects, a total thickness of the piezoelectric substrate (e.g., including at least one piezoelectric layer and optional dielectric or spacer layers) can be between 0.05 and 10 times. In some aspects, the total thickness of the piezoelectric substrate can be between 0.2 and 1 times the resonant wavelength as described above with respect to FIGS. 6A and 6B. A spacer layer thickness of more than 5 times the resonant wavelength can be chosen to decouple the first and second resonators 710 and 720.

Figure 8:
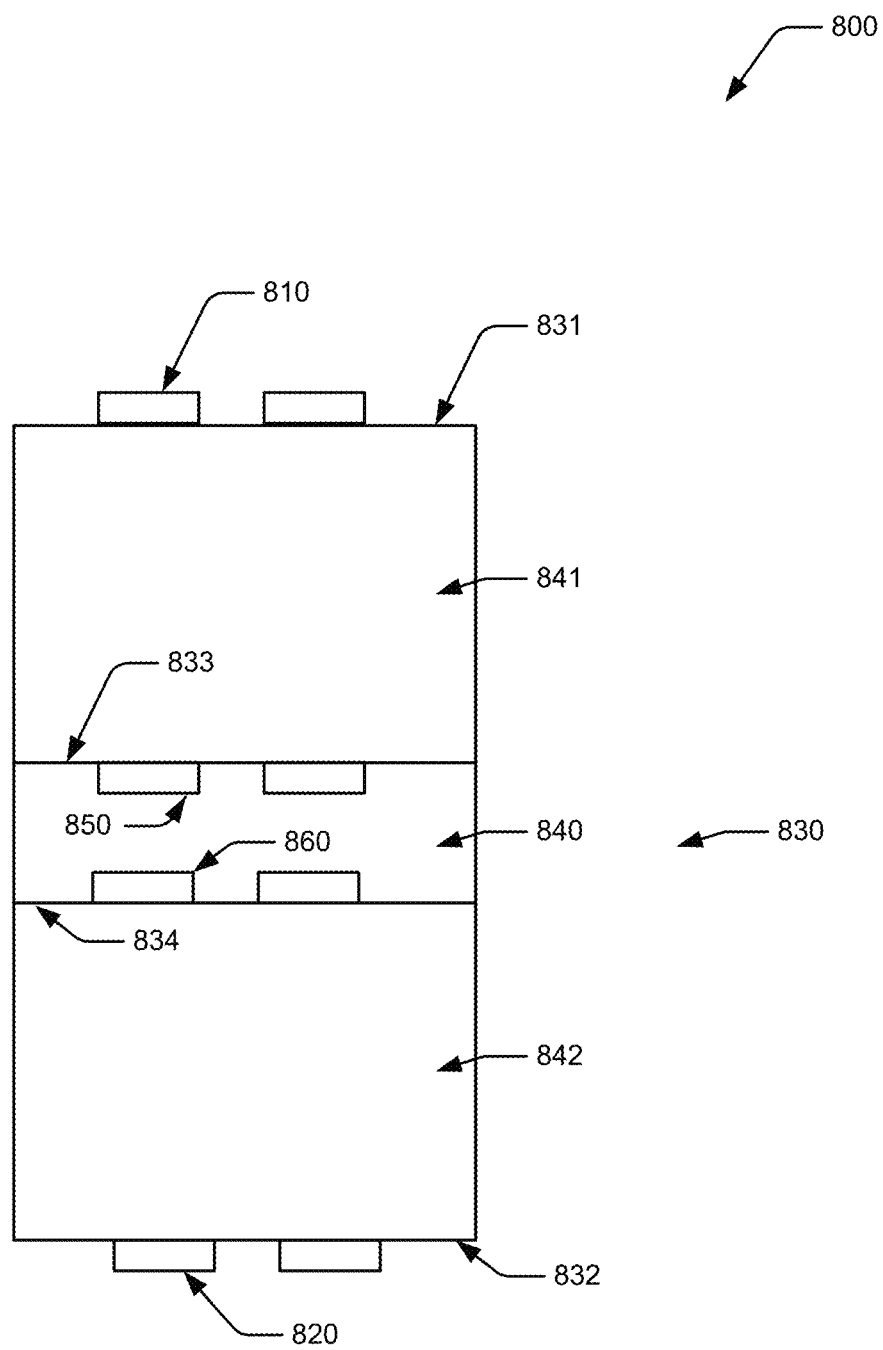
FIG. 8 is a cross-section side view of a piezoelectric substrate with multiple piezoelectric layers and a spacing layer, with additional resonators in the spacing layer, and having vertically coupled resonators in accordance with aspects described herein.

FIG. 8 is a cross-section side view 800 of a piezoelectric substrate with two piezoelectric layers and a spacing layer, with additional resonators in the spacing layer, and having vertically coupled resonators in accordance with aspects described herein. The cross-section side view 800 shows a device similar to the device illustrated in FIG. 7, but with additional resonators positioned in a spacer layer 840. Just as in FIG. 7, FIG. 8 illustrates a piezoelectric substrate 830 comprising a first piezoelectric layer 841, a second piezoelectric layer 842, and a spacer layer 840 between the two piezoelectric layers 841, 842. In FIG. 8, a first resonator 810 is provided on a first surface 831 (e.g., top surface) of the first piezoelectric layer 841 and a second resonator 820 is provided on a second surface 832 (e.g., bottom surface) of the second piezoelectric layer 842. Further, in FIG. 8, the spacer layer 840 has a boundary (or contact surface) 833 with the first piezoelectric layer 841 and a boundary (or contact surface) 834 with the second piezoelectric layer 842. A third resonator 850 is formed on or over the boundary (e.g., on the bottom surface) of the first piezoelectric layer 841, and a fourth resonator 860 is formed on or over the boundary (e.g., on the top surface) of the second piezoelectric layer 842 and inside the spacer layer 840. In an aspect, a first IDT of the first resonator 810 is disposed over a top surface of the first piezoelectric layer 841 and a third IDT of the third resonator 850 is disposed over a bottom surface of the first piezoelectric layer 841 while a second IDT of the second resonator 820 is disposed over a bottom surface of the second piezoelectric layer 842 and a fourth IDT of the fourth resonator 860 is disposed over a top surface of the second piezoelectric layer 842. In an aspect the third IDT of the third resonator 850 and the fourth IDT of the fourth resonator 860 are embedded in the spacer layer 840 (e.g., they are embedded in a dielectric layer).

The placement of the third resonator 850 and the fourth resonator 860 allows further density and reduced size of an AW resonator package, and can allow for further complexity in the coupling of resonators.

Although two piezoelectric layers are shown in the exemplary implementations of FIGS. 7 and 8, the present disclosure is not limited thereto. For example, the implementation of FIG. 8 can be extended by stacking a further spacer layer below the second resonator 820 and repeating the layer stack consisting of fourth resonator 860, second piezoelectric layer 842, and second resonator 820 to add a further piezoelectric layer. By repetition, three, four, or more piezoelectric layers may be provided in the piezoelectric substrate 830. Similarly, two layer stacks as shown in FIG. 7 may be combined with a further spacer layer between them as a piezoelectric substrate. In all implementations presented herein, the spacer layer 740, 840 may include more than one layer, e.g., two or more layers wherein at least two layers are made from different dielectric materials. Different dielectric materials may be provided to decouple the first and second resonators. Alternatively or additionally, the spacer layer may include one or more temperature compensation layers, e.g., one temperature compensation layer over each of the third and fourth resonators 850 and 860 in FIG. 8. A dielectric layer may be provided between the two temperature compensation layers. In some implementations, the spacer layer 840 may be replaced by one or more cavities, (e.g., filled with air or an inert gas), wherein the respective resonators are provided within the one or more cavities. The one or more cavities may, for instance, be formed using a frame and/or spacers provided as part of the spacer layer 840 between the bottom surface 833 of the first piezoelectric layer 841 and the top surface 834 of the second piezoelectric layer 842.

Figure 9:
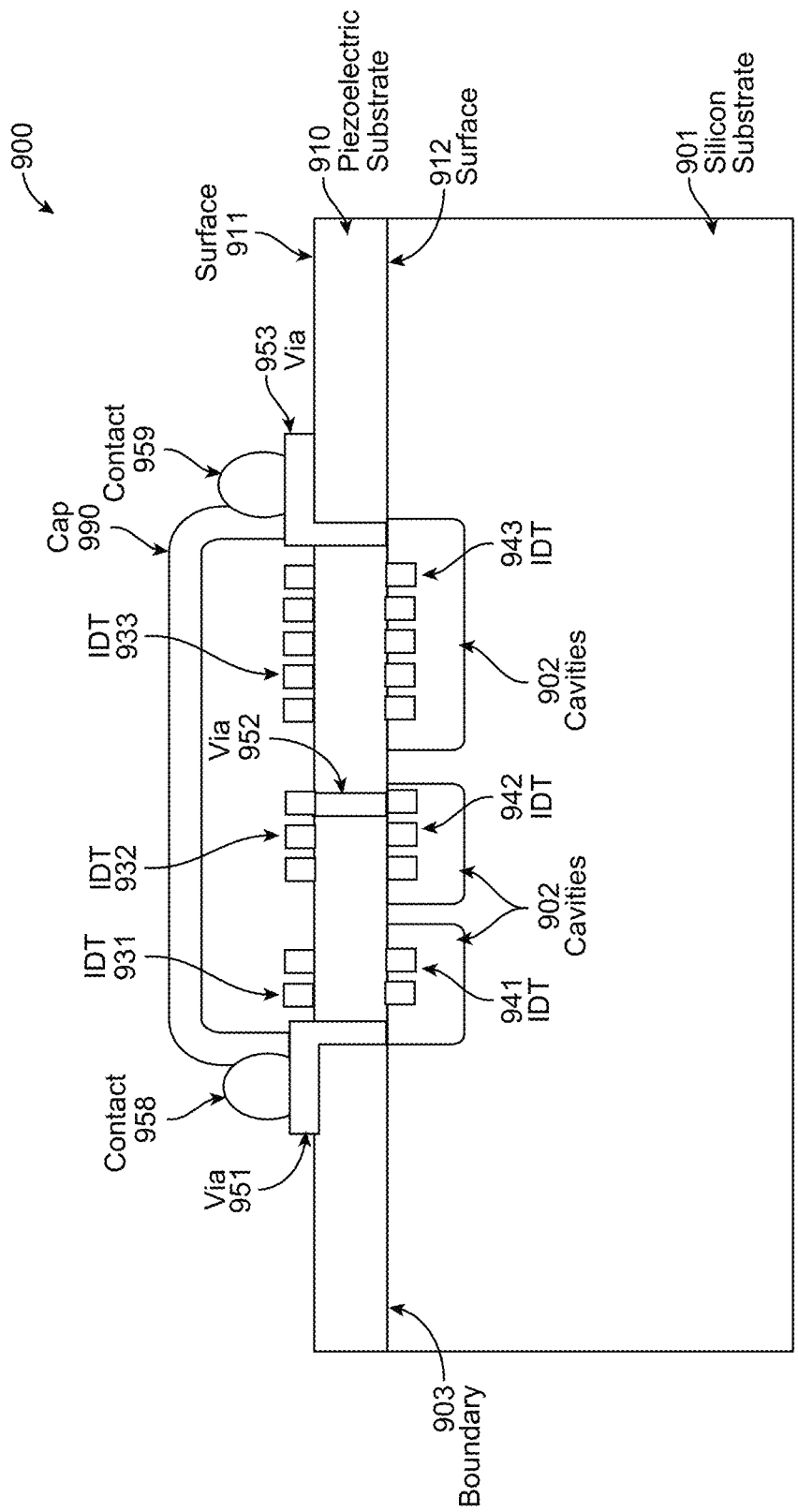
FIG. 9 is a cross-section side view of an AW filter package including a piezoelectric substrate having vertically coupled resonators in accordance with aspects described herein.

FIG. 9 is a cross-section side view of an AW package 900 including a piezoelectric substrate 910 having vertically coupled resonators in accordance with aspects described herein. The AW package 900 illustrates how packaging can be used to form a packaged device with resonators coupled vertically as described above. In AW package 900, the piezoelectric substrate 910 has a top surface 911 and a bottom surface 912, with three resonators illustrated on each of the top surface 911 and the bottom surface 912. The present disclosure is, however, not limited to the illustrated implementation but may comprise fewer or more resonators, e.g., at least one resonator on each surface. The resonators on the top surface are formed with illustrated electrode fingers of IDTs 931, 932, and 933. The resonators on the bottom surface are formed with illustrated electrode fingers of IDTs 941, 942, and 943.

Electrical connections between the resonators are shown as vias 951, 952, and 953. Connections (not shown) may also be provided between IDTs (e.g., on a top surface 911). Contacts 958 and 959 can provide input and output connections for a signal that is processed by a filter formed of the resonators comprising the IDTs 931, 932, 933, 941, 942, and 943. The IDTs 932, 932, and 933 formed on the surface 911 are protected by cap 990. The IDTs 941, 942, and 943 formed on the surface 912 of the piezoelectric substrate 910 are positioned within cavities 902 formed in a top surface of a substrate 901 (e.g., silicon) that supports the piezoelectric substrate 910, e.g., that is bonded to the piezoelectric substrate 910. The piezoelectric substrate 910 is supported at boundary 903 along the surface 912 where the substrate 901 contacts the surface 912 at boundary 903 where there is no cavity 902 in the substrate 901. The cavities 902 and the cap 990 create protected spaces around the IDTs that allow the IDTs to operate without interference from materials that would prevent the electroacoustic resonance described above as part of the operation of SAWs.

In one implementation, the AW package 900 can be a filter device with a three stage filter, with each top and bottom pair of resonators forming a stage of the filter as described above in FIGS. 4A and 4B. As mentioned above, fewer or more stages, e.g., at least one stage, may be provided. The resonance characteristics of the vertically coupled pairs of resonators and IDTs, including a first pair comprising IDT 931 and IDT 941, a second pair comprising IDT 932 and IDT 942, and a third pair comprising IDT 933 and IDT 943 can be designed including not only the pitch and electrode finger details for each IDT, but also the vertical coupling, to create a compact filter in accordance with aspects described herein.

In some aspects, the AW package 900 can be formed with a series of process steps as described below. The AW package 900 can start with a bulk wafer of piezoelectric material used for the piezoelectric substrate 910. One or more via holes through the piezoelectric substrate 910 are created from the surface 911 to the surface 912, and the conductive vias 951, 952, 953 are formed from the first surface 911 to the second surface 912 using the one or more via holes. A first acoustic layer (e.g., resonator layer) including the IDTs 931, 932, and 933 is fabricated on the first surface 911 of the piezoelectric substrate 910, along with connections to the vias 951, 952, and 953 and connections between the IDTs 931, 932, and 933 depending on the filter configuration of the AW package. The bulk wafer is then flipped, and the second acoustic layer including the IDTs 941, 942, and 943 is fabricated, along with any connections to the vias 951, 952, 953 depending on the filter configuration.

The silicon substrate 901 is etched to form the cavities 902, and the piezoelectric substrate 910 is bonded to the silicon substrate 901 at the boundary 903 such that the IDTs 941, 942, and 943 are aligned with (e.g., provided within) the cavities 902. Contacts 958 and 959 and the cap 990 can then be formed on the top surface 911. In various implementations, the individual packages can be separated from the bulk wavers at any point in the process depending on the particular fabrication implementation In FIG. 9, the cap 990 can be an encapsulant material or a rigid cap configured to protect the top IDTs 931, 932, and 933. In some aspects, the cap is made out of a polymer or a plasma enhanced chemical vapor deposition (PECVD) deposited material such as Silicon Nitride. Other implementations can use other protective structures as described below.

Figure 10:
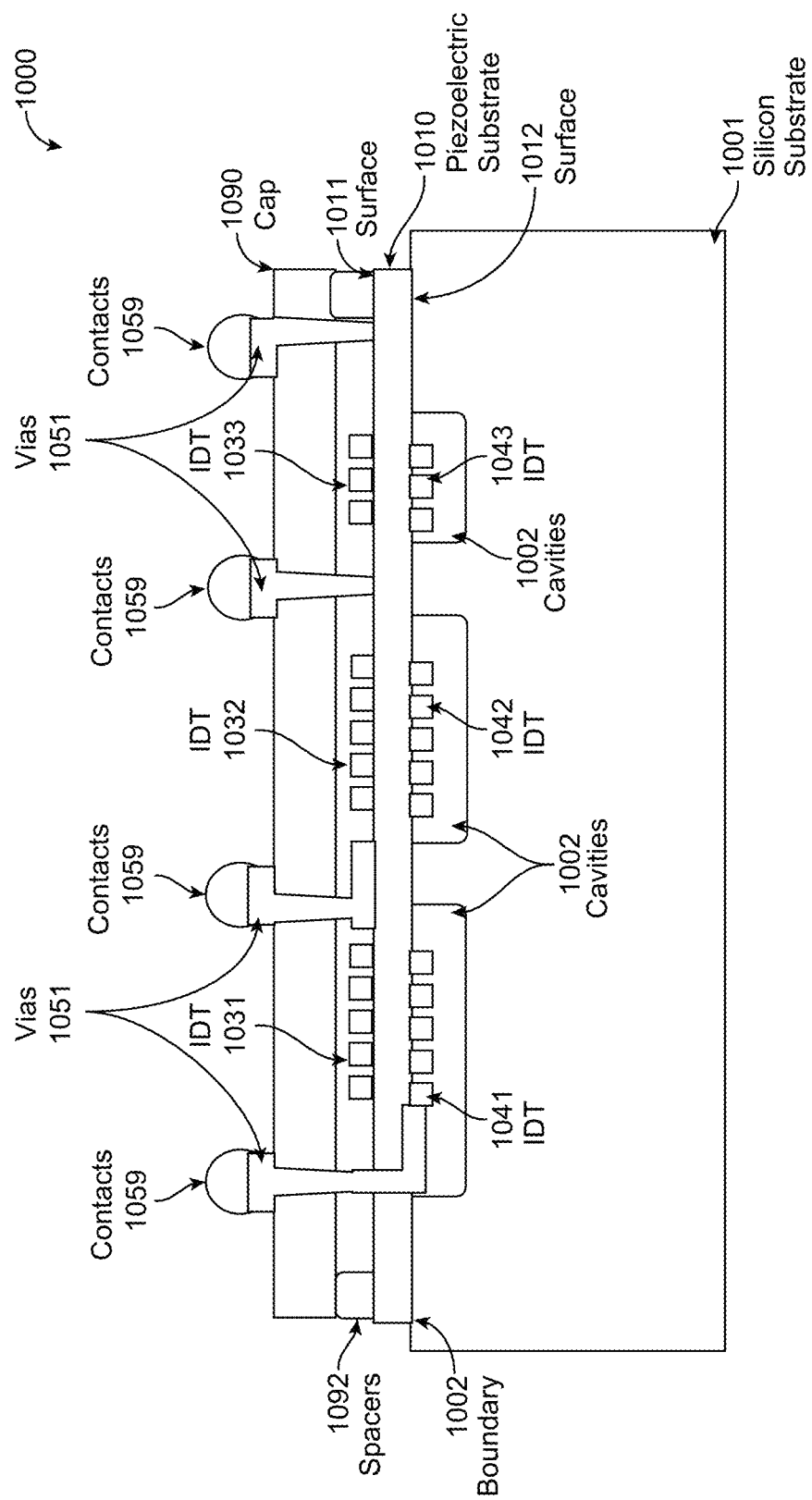
FIG. 10 is a cross-section side view of an AW filter package including a piezoelectric substrate having vertically coupled resonators in accordance with aspects described herein.

FIG. 10 is a cross-section side view of an AW package 1000 including a piezoelectric substrate 1010 having vertically coupled resonators in accordance with aspects described herein. The AW package 1000 is similar to the AW package 900 of FIG. 9, with the AW package including a substrate 1001 (e.g., silicon or other suitable material) with cavities 1002, and boundary 1003 where the piezoelectric substrate 1010 is supported by the substrate 1001. The piezoelectric substrate has IDTs 1031, 1032, and 1033 on surface 1011, and IDTs 1041, 1042, and 1043 on the surface 1012 of the piezoelectric substrate (e.g., the surface on an opposite side of the piezoelectric substrate 1010 from the surface 1012). In contrast with the AW package 900, the cap 1090 of the AW package 1000 is a glass cap 1090 having vias 1051, some of which are formed through the glass cap 1090, and some of which are formed through both the glass cap 1090 and the piezoelectric substrate 1010. In some cases the cap 1090 may be formed of another material such as the same material as the piezoelectric substrate 1010. The contacts 1059 are provided on top of the cap 1090, (e.g., on top of the vias 1051.) Spacers 1092 separate the cap 1090 from the surface 1011 of the piezoelectric substrate 1010. Such a structure with glass cap 1090 can facilitate more complex IDT arrangements on the surface 1011, and the use of spacers 1092 as mechanical support structures to create a space for operation of the IDTs 1031, 1032, 1033 between the cap 1090 and the surface 1011 can improve mechanical stability of the AW package 1000.

Figure 11:
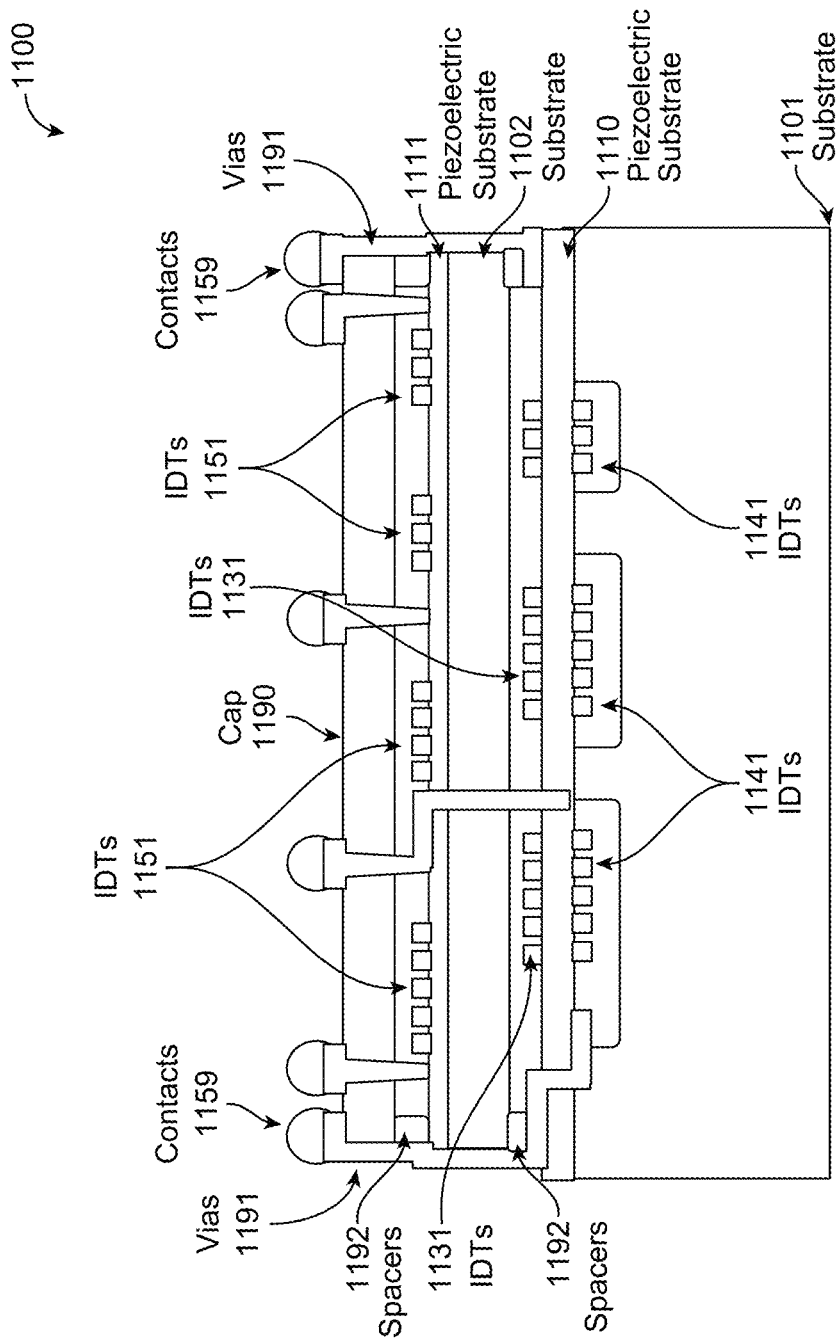
FIG. 11 is a cross-section side view of an AW filter package including a piezoelectric substrate illustrating details of vertically coupled resonators in accordance with aspects described herein.

FIG. 11 is a cross-section side view of an AW package 1100 including two piezoelectric layers in a stacked package similar to the AW package 300, illustrating details of vertically coupled resonators in accordance with aspects described herein.

As shown, the AW package 1100 includes two piezoelectric layers 1111 and 1110. The piezoelectric layer 1111 does not have vertically coupled IDTs, but includes IDTs 1151 on one side of the piezoelectric layer 1111, with substrate 1102 (e.g., a silicon substrate) providing support for the piezoelectric layer 1111. A second piezoelectric layer 1110 includes vertically coupled resonators formed from 1131 and 1141 on a top and bottom surface of the piezoelectric layer 1110 as described above, with a supporting substrate 1101 (e.g., a silicon substrate) used as a base substrate for the multi-tier package. A cap 1190 provides a cover for the top IDTs 1151. Spacers 1192 provide structural support for the various layers and the cap, and electrical connections are formed via vias 1191 and contacts 1159. The cap 1190 and spacers 1192 may be formed from a variety of materials.

Figure 12:
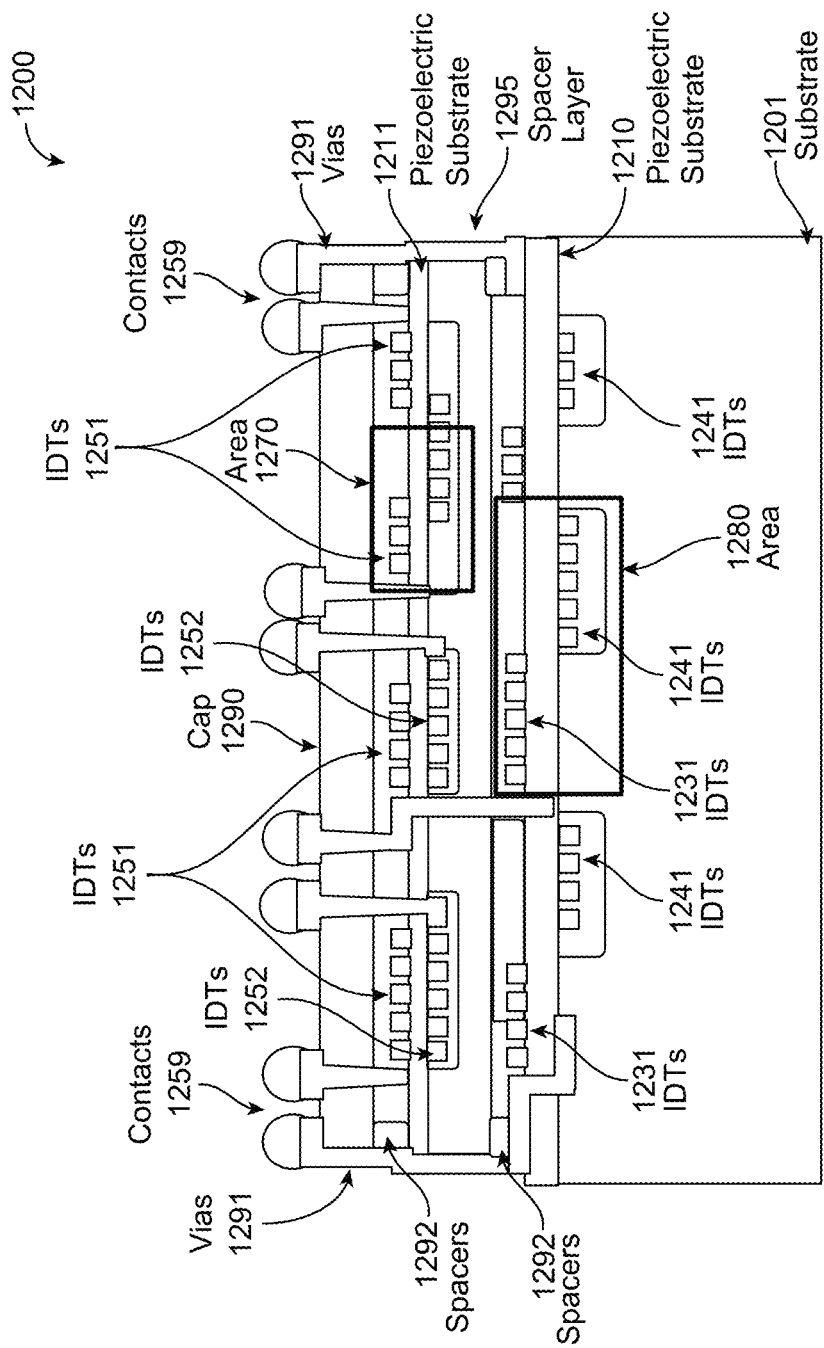
FIG. 12 is a cross-section side view of an AW filter package including two piezoelectric layers having vertically coupled resonators in accordance with aspects described herein.

FIG. 12 is a cross-section side view of an AW package 1200 including two piezoelectric substrates having vertically coupled resonators in accordance with aspects described herein. The AW package 1200 includes a first piezoelectric substrate 1211 and a second piezoelectric substrate 1210. The piezoelectric substrate 1211 has vertically coupled IDTs 1251 and 1252 on opposite sides. The piezoelectric substrate 1211 is separated from a cap 1290 using spacers 1292, with vias 1291 providing an electrical coupling from the various IDTs 1231, 1241, 1251, 1252 to contacts 1259 on top of the cap 1290. The second piezoelectric substrate is mounted on a supporting substrate 1201 (e.g., a silicon substrate) with cavities in the substrate 1201 to provide an area for lower piezoelectric surface IDTs 1241 between a lower piezoelectric surface of the piezoelectric substrate 1210 and the substrate 1201. Spacers 1292 separate a spacer layer 1295 from a top piezoelectric surface of the piezoelectric substrate that has IDTs 1231. The spacer layer 1295 acts as a substrate (e.g., similar to the substrate 1201) for the piezoelectric substrate 1211, with the lower IDTs 1252 positioned in cavities of the spacer layer 1295 such that the spacer layer 1295 acts as a protective layer for the lower IDTs 1252 of the first piezoelectric substrate.

Areas 1270 and 1280 illustrate different areas where electroacoustic coupling across piezoelectric layers of the piezoelectric substrates 1211 and 1210 can occur. As illustrated and described herein, the IDTs on top and bottom surfaces can be positioned with different amounts of vertical overlap to adjust or select filter characteristics associated with vertical electroacoustic coupling across the corresponding piezoelectric layers. Area 1270, for example, illustrates a partial overlap between the IDT 1251 on the top piezoelectric surface of the piezoelectric substrate and the IDT 1252 on the lower piezoelectric surface of the piezoelectric substrate 1211 within the area 1270. In the area 1280, the upper IDT 1231 in the area 1280 does not overlap with the IDT 1241 in the area 1280.

Figure 13:
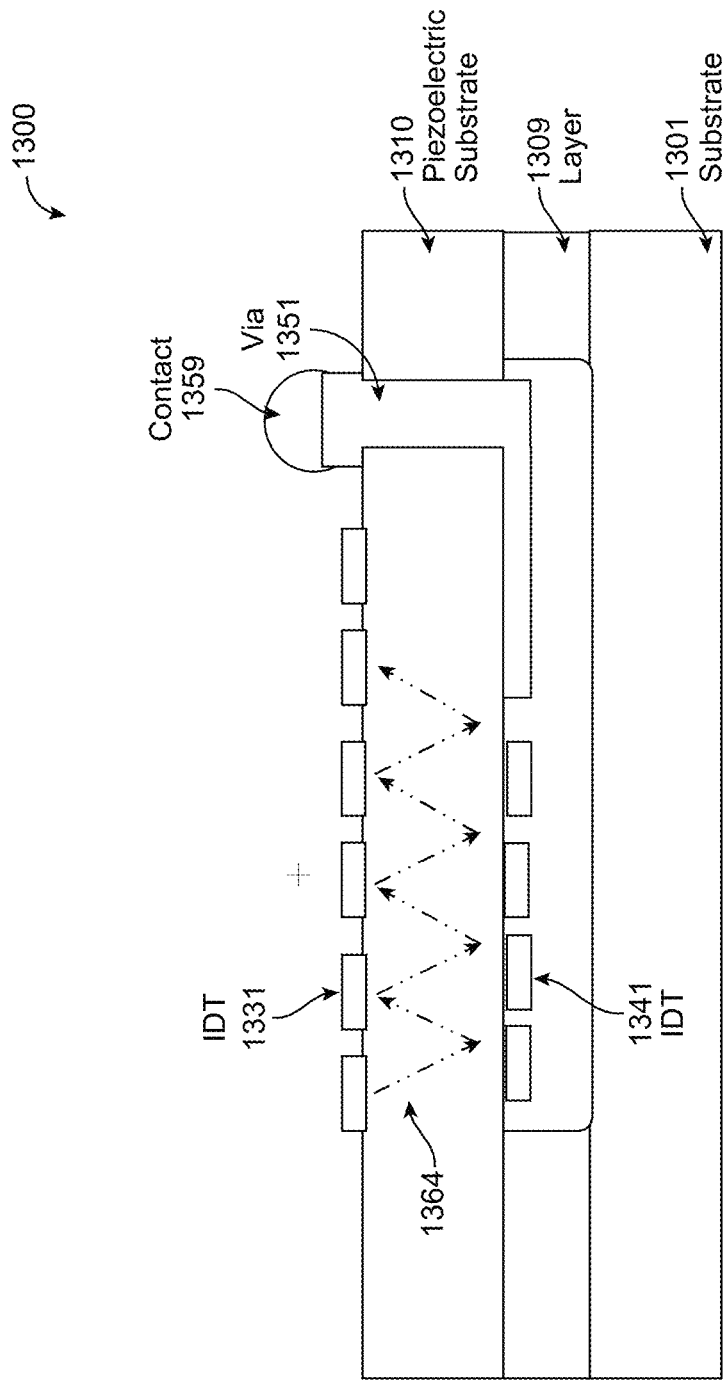
FIG. 13 is a cross-section side view of aspects of a piezoelectric substrate that can be used in an AW package in accordance with aspects described herein.

FIG. 13 is a cross-section side view: 1300 of aspects of a piezoelectric substrate that can be used in an AW package in accordance with aspects described herein. FIG. 13 includes a piezoelectric substrate 1310 having a top IDT 1331 on a top piezoelectric surface and a bottom IDT 1341 on a lower piezoelectric surface. A protective layer 1309 protects the lower IDT 1341, and is used to mount (e.g., via bonding) the piezoelectric substrate 1310 to a supporting substrate 1301 (e.g., a silicon substrate). A via 1351 connects the lower IDT 1341 to the upper IDT 1331, and a contact 1359 allows the IDTs to be electrically coupled to other portions of a device (e.g., other portions of an RF filter). Vertical signal paths 1364 within the piezoelectric substrate 1310 allow vertical coupling between the upper and lower IDTs 1331 and 1341.

Figure 14:
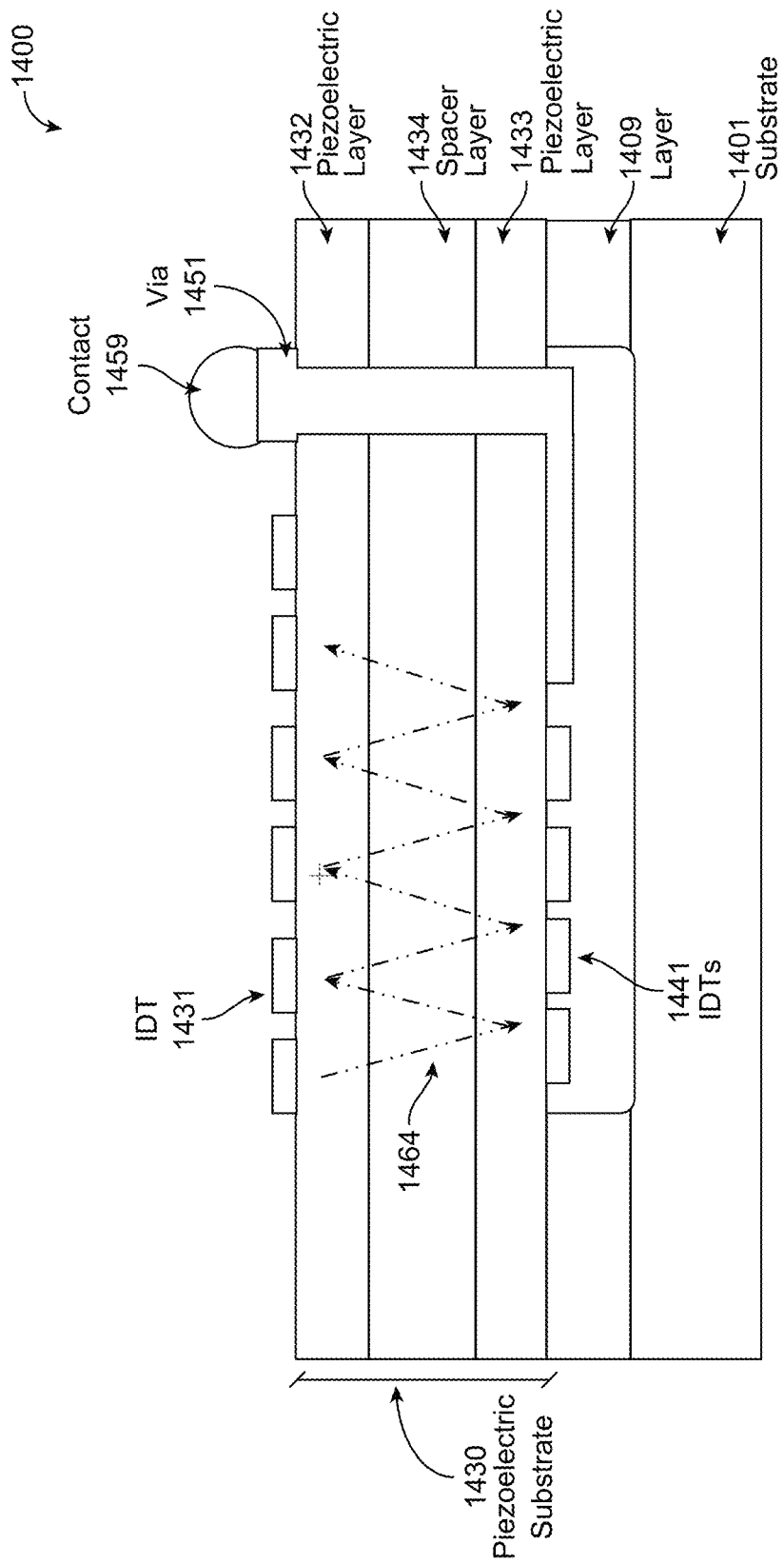
FIG. 14 is a cross-section side view of aspects of a piezoelectric substrate that can be used in an AW package in accordance with aspects described herein.

FIG. 14 is a cross-section side view 1400 of aspects of a piezoelectric substrate that can be used in an AW package in accordance with aspects described herein. FIG. 14 illustrates a piezoelectric substrate 1430 having an upper piezoelectric layer 1432, a lower piezoelectric layer 1433, and a dielectric spacer layer 1434. A top IDT 1431 is disposed over an upper piezoelectric surface, and a lower IDT 1441 is disposed over a lower piezoelectric surface. As used herein, an IDT layer "disposed over" a piezoelectric surface uses "over" relative to a central portion of a substrate, such that the IDT layer disposed over an upper layer can be positioned in an opposite direction to the IDT layer disposed over the lower layer, as the over position is relative to the central portion of the piezoelectric substrate having the upper and lower surface. A via 1451 provides an electrical connection between the IDTs 1431 and 1441, with a contact 1459 for electrical connections to other elements (e.g., other components of an RF filter). A protective layer 1409 is used to protect the lower IDT 1441 and for mounting the piezoelectric substrate 1430 to a supporting substrate 1401 (e.g., a silicon substrate).

In different implementations, the cross section side view 1300 or the cross section side view: 1400 can be used as possible implementations of the areas 1270 and 1280 of FIG. 12. As described herein, vertical alignment can vary between different implementations to achieve different electroacoustic coupling across a piezoelectric substrate or a piezoelectric layer for IDTs in on different piezoelectric surfaces where electroacoustic coupling across a layer determines a filter characteristic of a device. As described above in FIGS. 5A, 5B, 6A, and 6B, some implementations can use a piezoelectric substrate with a single piezoelectric layer. As described in FIG. 7, other piezoelectric substrates can include multiple piezoelectric layers separated by a spacer layer. Multi-tier AW packages such as the AW package 1200 can use either a single layer piezoelectric substrate or a multilayer piezoelectric substrate, as illustrated by FIGS. 13 and 14.

In FIG. 13, the vertically coupled resonators comprising the IDTs 1331 and 1341, when excited, generate not only surface waves, but also vertical signal paths 1364 based on the vertical coupling between the IDTs 1331 and 1341. The combination of the surface waves and the vertical signal paths 1364 can generate a complex filter response based on electrical signals input at an input contact of a filter, output at an output contact of a filter, and communicated between contacts and resonators by vias of the filter (e.g., the contact 1359 and the via 1351). Similarly, in the cross section view 1400 of FIG. 14, the IDT 1431 and the IDT 1441 can generate vertical signal paths 1464 in addition to surface wave paths. As described above, the design of the coupling that generates vertical signal paths 1364 or 1464 can be based on a pitch of the electrode fingers of the vertically coupled IDTs 1331 and 1341 or 1431 and 1441, the thickness of the piezoelectric substrate separating the vertically coupled IDT pairs, including the spacer layer 1434 if provided, the material that forms the corresponding piezoelectric substrate, and any offset (e.g. areas of non-overlap in the vertical direction) between the electrode fingers of the vertically coupled IDT pairs. Such configurations can be used as described herein to offer additional parameter spaces for shaping filter functions when designing devices that use AW filters in accordance with aspects described herein. In some aspects, differently polarized modes of the vertically coupled IDT pairs can be designed to form a passband, which can allow tailoring of mode characteristics to combine the advantages of two modes. In some aspects, considering the coupling can allow reduced filter size while designing vertical multi-tier packaging that is "almost decoupled", or designed to a size where coupling occurs, but is set to benefit or provide a minimal impact on the filter performance.

Figure 15:
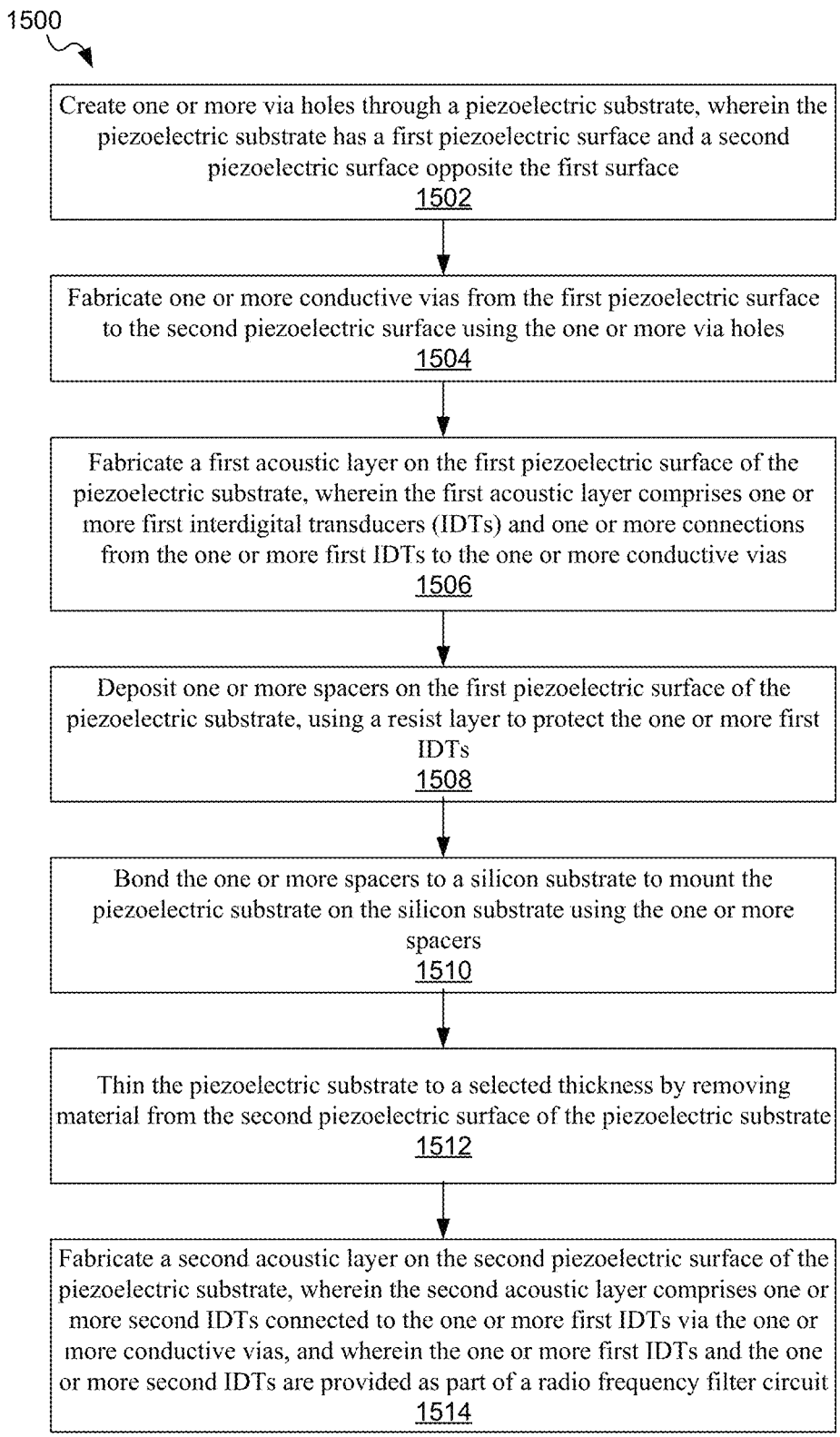
FIG. 15 is a flowchart illustrating a method of manufacturing of a vertically coupled filter, in accordance with examples described herein.

FIG. 15 is a flowchart illustrating a method 1500 (or process) of fabrication of one aspect of an apparatus including vertically coupled resonators. The method 1500 is described in the form of a set of blocks that specify operations that can be performed. However, operations are not necessarily limited to the order shown in FIG. 15 or described herein, as the operations may be implemented in alternative orders or in fully or partially overlapping manners. Also, more, fewer, and/or different operations may be implemented to perform the method 1500, or an alternative approach. In some implementations, the method 1500 can be implemented by control or processing circuitry of systems for fabrication of a wireless apparatus (e.g., electronic device 1702) configuring the fabrication of a resonator circuit. In some implementations, the method 1500 can be implemented as instructions stored in a non-transitory computer readable storage medium, that, when executed by one or more processors of an apparatus (e.g., fabrication systems), cause the apparatus to perform the operation of the method 1500.

At block 1502, the method 1500 includes creating one or more via holes through a piezoelectric substrate, wherein the piezoelectric substrate has a first piezoelectric surface and a second piezoelectric surface opposite the first surface.

At block 1504, the method 1500 includes fabricating one or more conductive vias from the first piezoelectric surface to the second piezoelectric surface using the one or more via holes.

At block 1506, the method 1500 includes fabricating a first acoustic layer over the first piezoelectric surface of the piezoelectric substrate, wherein the first acoustic layer comprises one or more first interdigital transducers (IDTs) and one or more connections from the one or more first IDTs to the one or more conductive vias.

At block 1508, the method 1500 includes depositing one or more spacers on the first piezoelectric surface of the piezoelectric substrate, using a resist layer to protect the one or more first IDTs.

At block 1510, the method 1500 includes bonding the one or more spacers to a silicon substrate to mount the piezoelectric substrate on the silicon substrate using the one or more spacers:

At block 1512, the method 1500 includes thinning the piezoelectric substrate to a selected thickness by removing material from the second piezoelectric surface of the piezoelectric substrate.

At block 1514, the method 1500 includes fabricating a second acoustic layer over the second piezoelectric surface of the piezoelectric substrate, wherein the second acoustic layer comprises one or more second IDTs connected to the one or more first IDTs via the one or more conductive vias, and wherein the one or more first IDTs and the one or more second IDTs are provided as part of a radio frequency filter circuit.

The operations of the blocks described above can be combined with repeated operations or intervening operations to fabricate devices with multiple layers, multiple devices, or any configuration of vertically integrated IDTs in accordance with aspects described herein.

In some aspects, the IDTs such as the one or more first IDTs and the one or more second IDTs can be fabricated in positions relative to each other in different piezoelectric surfaces and layers to create IDTs with filter characteristics based on the relative positions across a piezoelectric layer, with electroacoustic coupling between the IDTs based on the relative positions and used as a filter characteristic of a device. For example, in some aspects, IDTs can be positioned directly across a piezoelectric layer from each other, with the electroacoustic coupling across the piezoelectric layer based on the piezoelectric layer thickness and the resonance of the fingers of the IDTs. In other aspects, IDTs can be offset from one another to modify the electroacoustic coupling across a piezoelectric layer. For example, in some aspects, a filter characteristic of an AW filter package filter is based on electroacoustic coupling between the one or more first IDTs and the one or more second IDTs through the piezoelectric substrate where the electroacoustic coupling through the piezoelectric substrate is based in part on an overlap between the one or more first IDTs and the one or more second IDTs in a vertical direction across the piezoelectric substrate. In other aspects, a projection of the one or more first IDTs onto the second piezoelectric surface in a perpendicular direction from the first piezoelectric surface does not overlap with the one or more second IDTs to reduce the electroacoustic coupling across the piezoelectric layer.

Figure 16A:
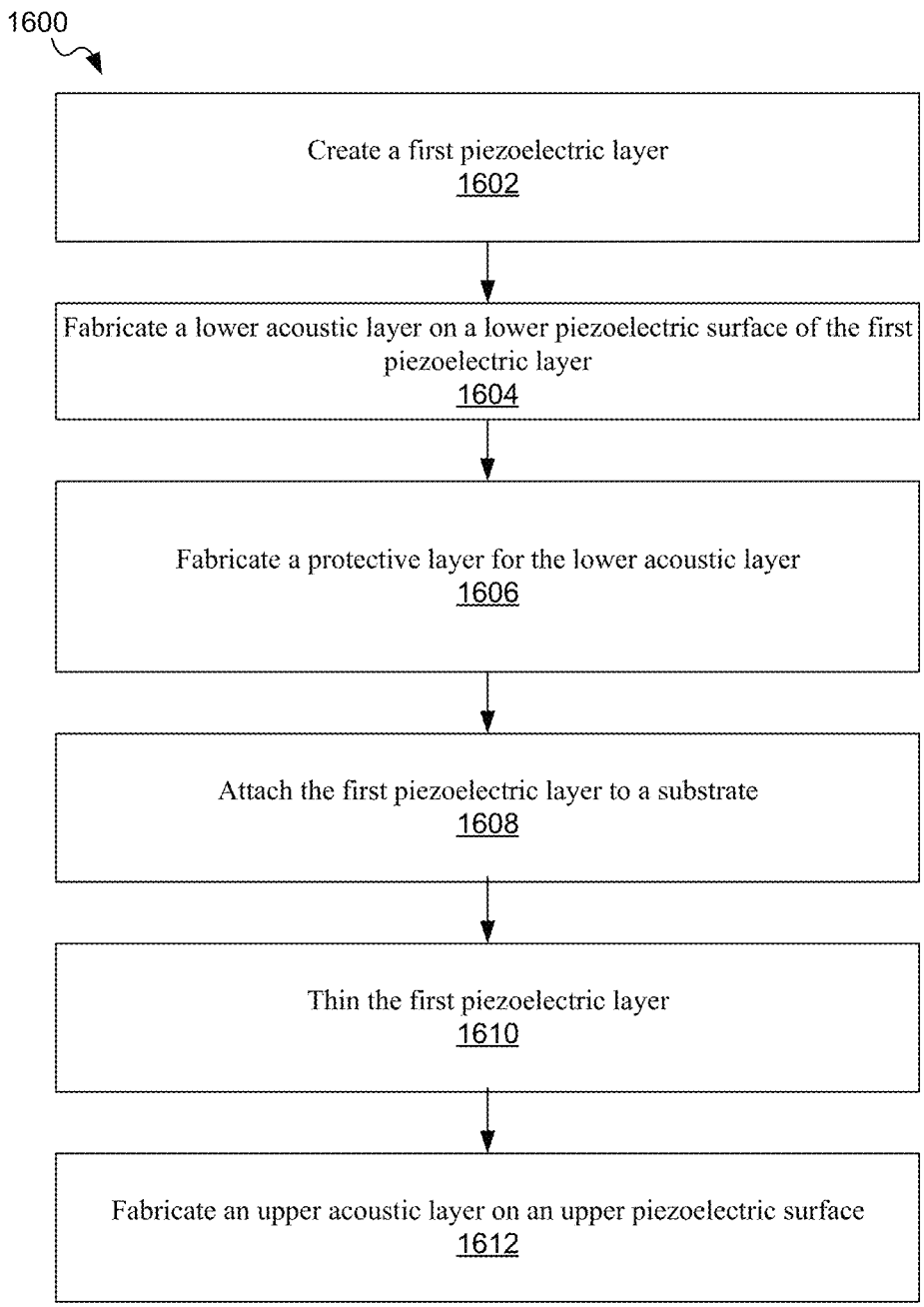
FIG. 16A is a flowchart illustrating a method of manufacturing of a vertically coupled filter, in accordance with examples described herein.

FIG. 16A is another flowchart illustrating a method 1600 (or process) of fabrication of one aspect of an apparatus including vertically coupled resonators. The method 1600 is described in the form of a set of blocks that specify operations that can be performed. However, operations are not necessarily limited to the order shown in FIG. 16A or described herein, as the operations may be implemented in alternative orders or in fully or partially overlapping manners. Also, more, fewer, and/or different operations may be implemented to perform the method 1600, or an alternative approach. In some implementations, the method 1600 can be implemented by control or processing circuitry of systems for fabrication of a wireless apparatus (e.g., electronic device 1702) configuring the fabrication of a resonator circuit. In some implementations, the method 1600 can be implemented as instructions stored in a non-transitory computer readable storage medium, that, when executed by one or more processors of an apparatus (e.g., fabrication systems), cause the apparatus to perform the operation of the method 1600.

At block 1602, the method 1600 includes creating a first piezoelectric layer. The first piezoelectric layer may be a piezoelectric layer in accordance with any description provided herein. The first piezoelectric layer can, for example, be a bulk wafer of any piezoelectric material described herein.

At block 1604, the method 1600 includes fabricating a lower acoustic layer (e.g., an IDT) over a lower piezoelectric surface of the first piezoelectric layer. The lower acoustic layer can, for example, be fabricated using a lithography process. As detailed above, this fabrication can include placement of the acoustic layer directly on the piezoelectric surface, or can involve intervening layers, with the lower acoustic layer disposed over the lower piezoelectric surface (e.g., with the over position relative to a center of the first piezoelectric layer).

At block 1606, the method 1600 includes fabricating a protective layer for the lower acoustic layer. The protective layer can, for example, be a silicon oxide (e.g., SiO2) layer fabricated using a sputter deposition process in areas selected to protect acoustically active areas.

At block 1608, the method 1600 includes attaching the first piezoelectric layer to a substrate. The substrate can, for example, be a silicon substrate bonded to the piezoelectric layer or bonded to the protective layer.

At block 1610, the method 1600 includes thinning the first piezoelectric layer. The thinning operations can be performed to create a selected thickness for the piezoelectric layer based on desired electroacoustic characteristics, including electroacoustic coupling between upper and lower acoustic layers and IDTs in the upper and lower acoustic layers. In some aspects, the piezoelectric layer can be thinned to approximately 400 nanometers (nm). In other aspects, other thicknesses can be used (e.g., between 50 nm and 1000 nm, or a given multiple of the IDT finger period as described herein).

At block 1612, the method 1600 includes fabricating an upper (e.g., second) acoustic layer over an upper piezoelectric surface (e.g., using a lithography process, which may be the same process from the block 1604). Just as above, such a fabrication can include disposing the upper acoustic layer on the piezoelectric surface, or can include fabrication of intervening layers, with the upper piezoelectric surface disposed over the piezoelectric layer with intervening layers between the upper acoustic layer and the upper piezoelectric surface (e.g., with the over positioning being relative to a center of the piezoelectric layer).

Figure 16B:
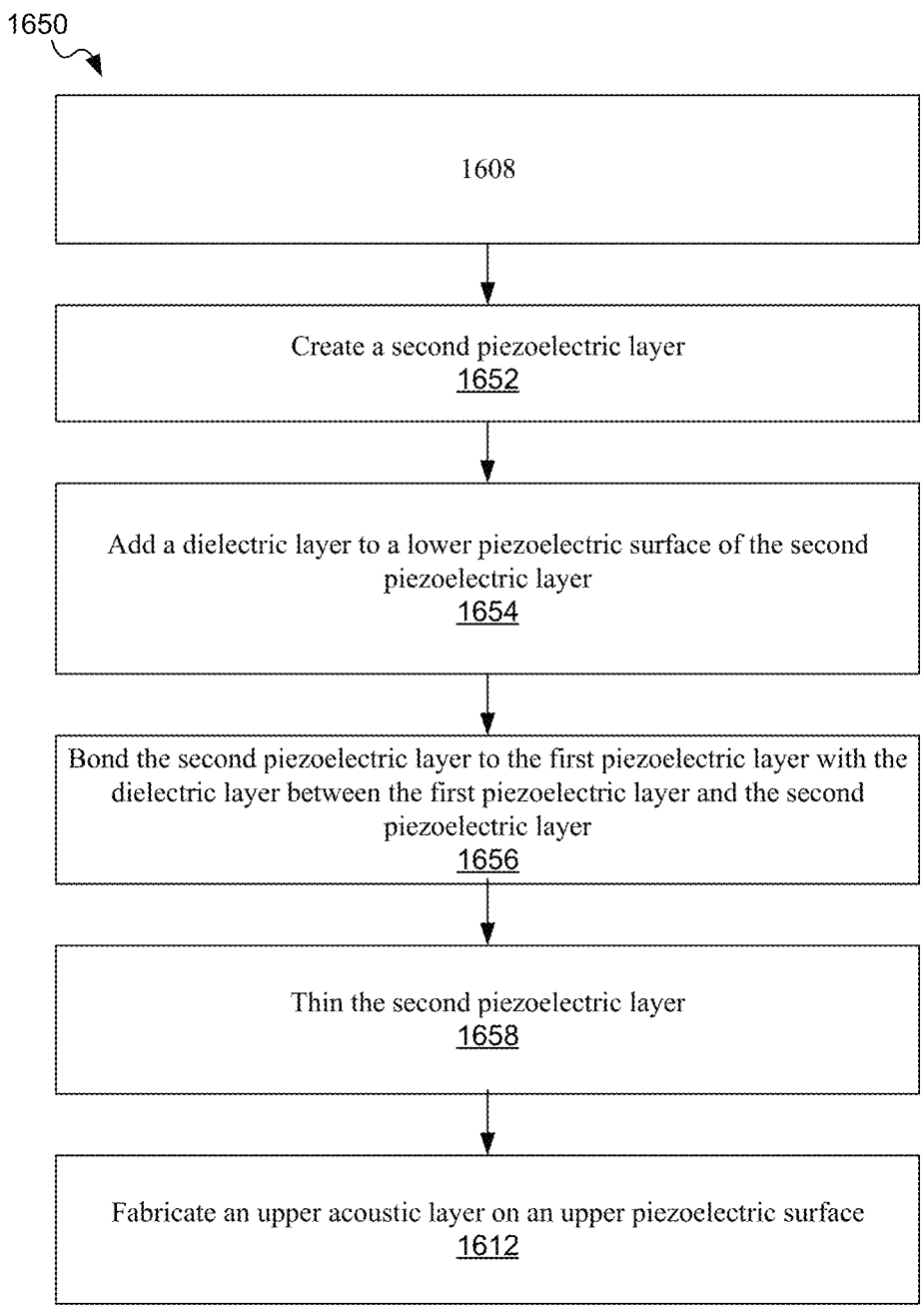
FIG. 16B is a flowchart illustrating a method of manufacturing of a vertically coupled filter, in accordance with examples described herein.

FIG. 16B is another flowchart illustrating a method 1650 (or process) of fabrication of one aspect of an apparatus including vertically coupled resonators. Just as with methods 1500 and 1600 above, method 1650 is described in the form of a set of blocks that specify operations that can be performed. However, operations are not necessarily limited to the order shown in FIG. 16B or described herein, as the operations may be implemented in alternative orders or in fully or partially overlapping manners. Also, more, fewer, and/or different operations may be implemented to perform the method 1650, or an alternative approach. In some implementations, the method 1650 can be implemented by control or processing circuitry of systems for fabrication of a wireless apparatus (e.g., electronic device 1702) configuring the fabrication of a resonator circuit. In some implementations, the method 1650 can be implemented as instructions stored in a non-transitory computer readable storage medium, that, when executed by one or more processors of an apparatus (e.g., fabrication systems), cause the apparatus to perform the operation of the method 1650.

The method 1650 includes the blocks 1602 through 1608 described above. Following the block 1608, however, the method 1650 then proceeds to the block 1652, which involves creating a second piezoelectric layer. The second piezoelectric layer may be a second bulk wafer similar to the bulk wafer of the first piezoelectric material or any other such piezoelectric layer.

At block 1654, the method 1650 includes adding a dielectric layer to a lower piezoelectric surface of the second piezoelectric layer. The dielectric layer can be the same material fabricated by the same process as the protective layer, but uniform rather than positioned around the acoustically active areas as described above. The dielectric layer can be a silicon oxide (e.g., SiO2) layer sputter deposited to a thickness of 400 nm in conjunction with first and second layers thinned to 100 nm. In other aspects, other combinations of piezoelectric layer thickness and dielectric layer thickness can be used.

At block 1656, the method 1650 includes bonding the second piezoelectric layer to the first piezoelectric layer with the dielectric layer between the first piezoelectric layer and the second piezoelectric layer. This bonding creates a piezoelectric substrate with top and bottom piezoelectric layers separated by a dielectric layer, with a protective layer separating the lower piezoelectric layer from a silicon substrate, with a protective layer creating protective gaps for the lower acoustic (e.g., IDT) layer.

At block 1658, the method 1650 includes thinning the second piezoelectric layer (e.g., to match the first or upper piezoelectric layer, and to create target filter characteristics).

The method 1650 then includes the operations of block 1612 of fabricating an upper acoustic layer over an upper piezoelectric surface. In contrast to block 1612 of the method 1650, the upper piezoelectric surface is a surface of the second piezoelectric layer in the method 1650, rather than a surface of the first piezoelectric layer in method 1650. Thus, while the method 1600 results in a device with the structure of FIG. 5A, 5B, 6A, or 6B (e.g., depending on the offset of the fabricated IDTs), the method 1650 results in a structure similar to that of FIG. 7, (e.g., the piezoelectric substrate 730 with two piezoelectric layers 741 and 742 as an upper and lower layer and a spacing layer 740 comprising a dielectric. Vertically coupled resonators 710 and 720 are in acoustic layers fabricated on the piezoelectric surfaces of the piezoelectric layers 741 and 742).

Additionally, it will be apparent that similar combinations of operations are possible using the described blocks to create any structure described herein, including the structure of FIG. 8, with four acoustic layers, as well as additional fabrication operations for adding vias and electrical connections between the acoustic layers.

Figure 17:
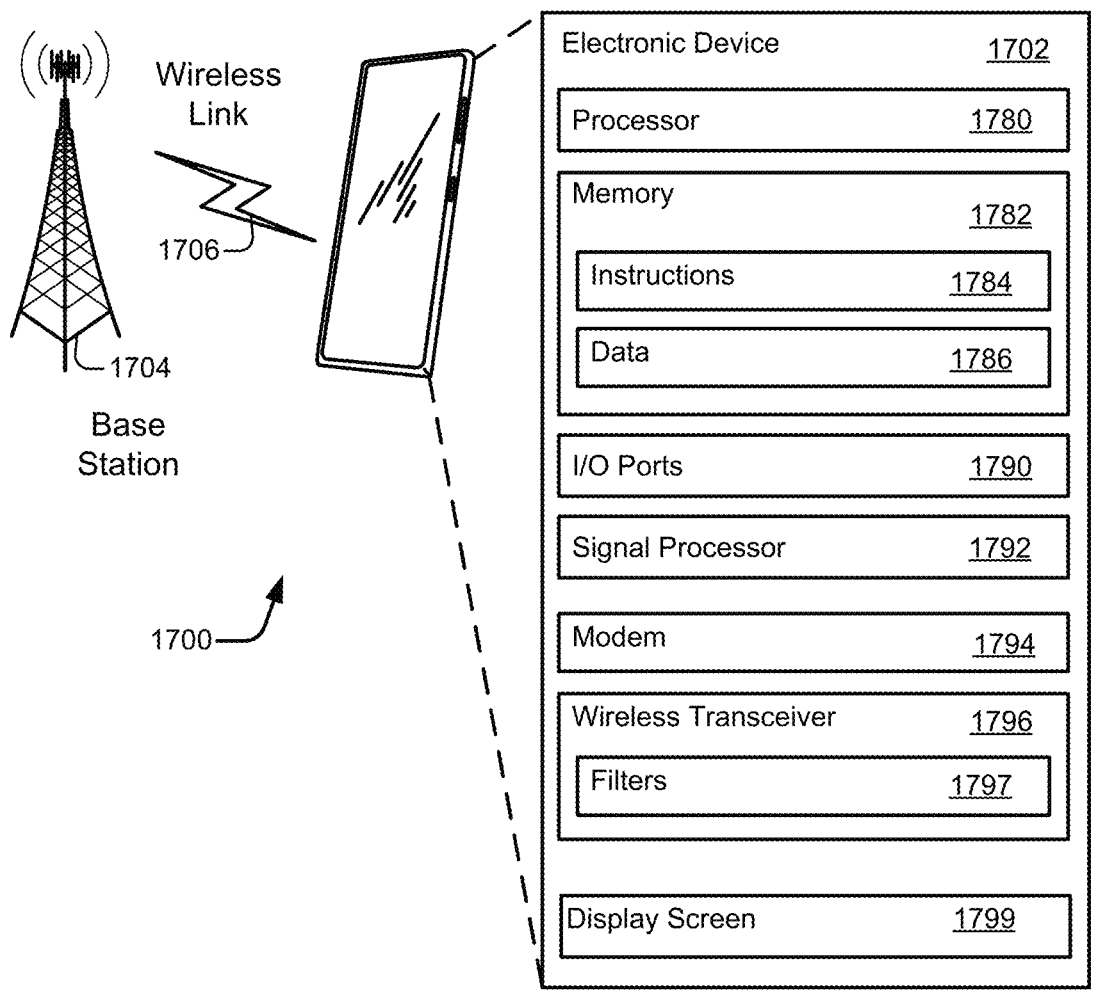
FIG. 17 is a diagram of an environment that includes an electronic device that includes filters that may be implemented using a vertically coupled filter in accordance with examples described herein.
Figure 18:
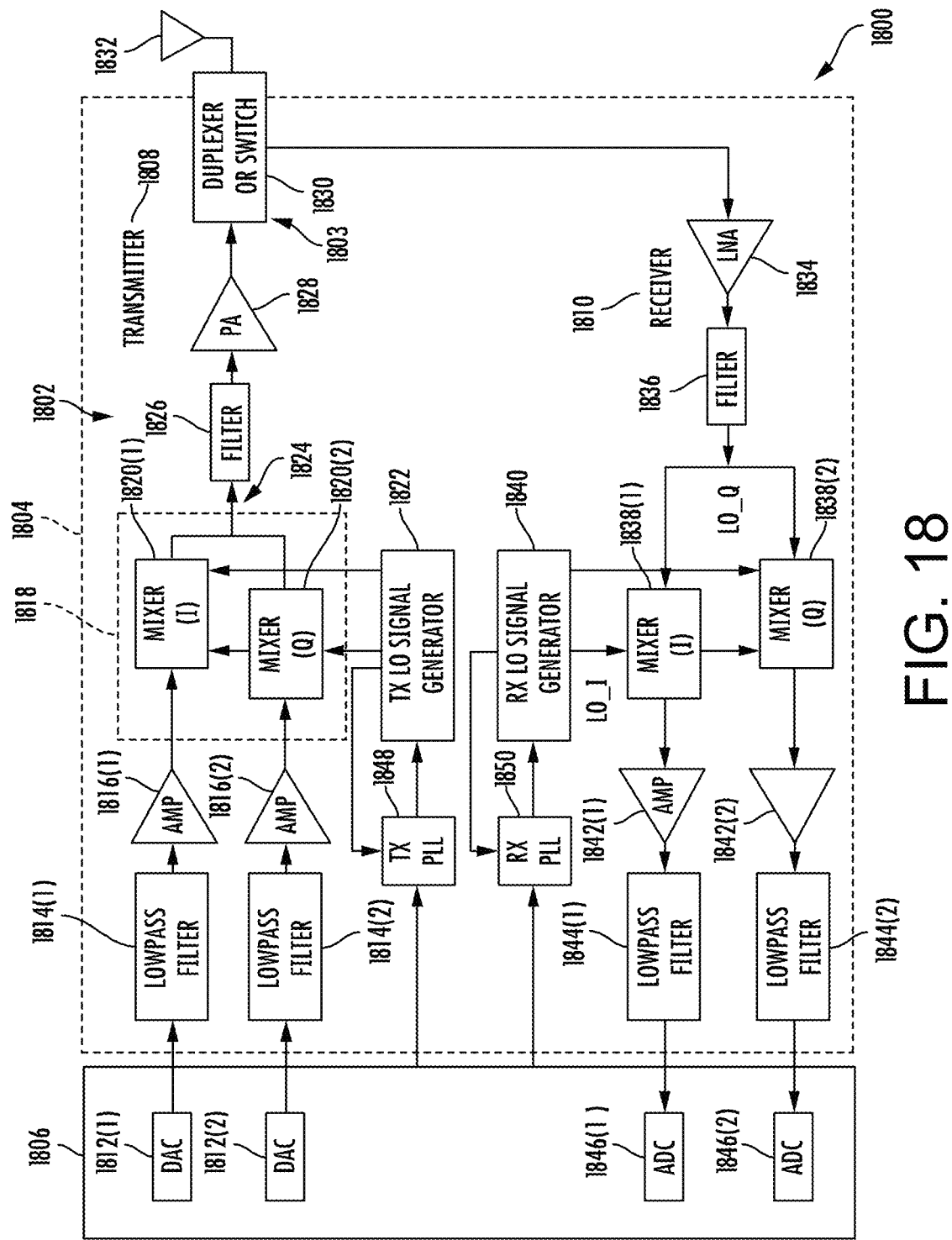
FIG. 18 is a block diagram of a wireless communication apparatus that includes a radio-frequency integrated circuit (RFIC), that includes a vertically coupled filter in accordance with aspects described herein.

FIG. 17 is a diagram of an environment 1700 that includes an electronic device 1702 that includes a wireless transceiver 1796, such as the circuitry illustrated in FIG. 18. Further, as illustrated, the wireless transceiver 1796 can include filters 1797. The filters 1797 can be implemented as vertically coupled filters as described herein. Additionally, while the electronic device 1702 is illustrated as having the wireless transceiver 1796 including the filters 1797, the base station 1704 can include similar wireless transceiver circuitry, implemented with stack AW filters as described herein.

In some aspects, the electronic device 1702 includes a display screen 1799 that can be used to display information associated with data transmitted via wireless link 1706 and processed using components of electronic device 1702 described below. Other aspects of an electronic device in accordance with aspects described herein using a low phase delay filter for multi-band communication can be configured without a display screen. In the environment 1700, the electronic device 1702 communicates with a base station 1704 through a wireless link 1706. As shown, the electronic device 1702 is depicted as a smart phone. However, the electronic device 1702 may be implemented as any suitable computing or other electronic device, such as a cellular base station, broadband router, access point, cellular or mobile phone, gaming device, navigation device, media device, laptop computer, desktop computer, tablet computer, server computer, network-attached storage (NAS) device, smart appliance, smartwatch, smart glasses, augmented reality (AR) glasses, an automobile including a vehicle-based communication system, a vehicular head unit, Internet of Things (IoT) device, sensor or security device, asset tracker, and so forth.

The base station 1704 communicates with the electronic device 1702 via the wireless link 1706, which may be implemented as any suitable type of wireless link. Although depicted as a base station tower of a cellular radio network, the base station 1704 may represent or be implemented as another device, such as a satellite, terrestrial broadcast tower, access point, peer to peer device, mesh network node, fiber optic line, another electronic device generally as described above, and so forth. Hence, the electronic device 1702 may communicate with the base station 1704 or another device via a wired connection, a wireless connection, or a combination thereof. The wireless link 1706 can include a downlink of data or control information communicated from the base station 1704 to the electronic device 1702 and an uplink of other data or control information communicated from the electronic device 1702 to the base station 1704. The wireless link 1706 may be implemented using any suitable communication protocol or standard, such as 3rd Generation Partnership Project Long-Term Evolution (3GPP LTE, 3GPP NR 5G), IEEE 802.11, IEEE 802.16, Bluetooth™, and so forth.

The electronic device 1702 includes a processor 1780 and a memory 1782. The memory 1782 may be or form a portion of a computer readable storage medium. The processor 1780 may include any type of processor, such as an application processor or a multi-core processor, that is configured to execute processor-executable instructions (e.g., code) stored by the memory 1782. The memory 1782 may include any suitable type of data storage media, such as volatile memory (e.g., random access memory (RAM)), non-volatile memory (e.g., Flash memory), optical media, magnetic media (e.g., disk or tape), and so forth. In the context of the disclosure, the memory 1782 is implemented to store instructions 1784, data 1786, and other information of the electronic device 1702, and thus when configured as or part of a computer readable storage medium, the memory 1782 does not include transitory propagating signals or carrier waves.

The electronic device 1702 may also include input/output (I/O) ports 1790. The I/O ports 1790 enable data exchanges or interaction with other devices, networks, or users or between components of the device.

The electronic device 1702 may further include a signal processor (SP) 1792 (e.g., such as a digital signal processor (DSP)). The signal processor 1792 may function similar to the processor and may be capable executing instructions and/or processing information in conjunction with the memory 1782.

For communication purposes, the electronic device 1702 also includes a modem 1794, a wireless transceiver 1796, and an antenna (not shown). The wireless transceiver 1796 provides connectivity to respective networks and other electronic devices connected therewith using radio-frequency (RF) wireless signals and may include the transceiver circuitry of FIG. 18. The wireless transceiver 1796 may facilitate communication over any suitable type of wireless network, such as a wireless local area network (LAN) (WLAN), a peer to peer (P2P) network, a mesh network, a cellular network, a wireless wide area network (WWAN), a navigational network (e.g., the Global Positioning System (GPS) of North America or another Global Navigation Satellite System (GNSS)), and/or a wireless personal area network (WPAN).

FIG. 18 illustrates a wireless communications device 1800 that includes RF components formed from one or more ICs 1802 and can include vertically coupled resonators as part of the filter(s) (e.g., the filters 1797) of the wireless transceiver 1796. The wireless communications device 1800 may include or be provided in any of the above-referenced devices as examples. As shown in FIG. 18, the wireless communications device 1800 includes a transceiver 1804 and a data processor 1806 (e.g., processing circuitry). The data processor 1806 may include a memory to store data and program codes. The transceiver 1804 includes a transmitter 1808 and a receiver 1810 that support bi-directional communications. In general, the wireless communications device 1800 may include any number of transmitters 1808 and/or receivers 1810 for any number of communication systems and frequency bands. All or a portion of the transceiver 1804 may be implemented on one or more analog ICs, RFICs, mixed-signal ICs, etc.

The transmitter 1808 or the receiver 1810 may be implemented with a super-heterodyne architecture or a direct-conversion architecture. In the super-heterodyne architecture, a signal is frequency-converted between RF and baseband in multiple stages, e.g., from RF to an intermediate frequency (IF) in one stage and then from IF to baseband in another stage. In the direct-conversion architecture, a signal is frequency-converted between RF and baseband in one stage. The super-heterodyne and direct-conversion architectures may use different circuit blocks and/or have different requirements. In the wireless communications device 1800 in FIG. 18, the transmitter 1808 and the receiver 1810 are implemented with the direct-conversion architecture.

In the transmit path, the data processor 1806 processes data to be transmitted and provides I and Q analog output signals to the transmitter 1808. In the wireless communications device 1800, the data processor 1806 includes digital-to-analog converters (DACs) 1812(1), 1812(2) for converting digital signals generated by the data processor 1806 into the I and Q analog output signals, e.g., I and Q output currents, for further processing.

Within the transmitter 1808, lowpass filters 1814(1), 1814(2) filter the I and Q analog output signals, respectively, to remove undesired signals caused by the prior digital-to-analog conversion. Amplifiers (AMPs) 1816(1), 1816(2) amplify the signals from the lowpass filters 1814(1), 1814(2), respectively, and provide I and Q baseband signals. An upconverter 1818 upconverts the I and Q baseband signals with I and Q transmit (TX) local oscillator (LO) signals from a TX LO signal generator 1822 through mixers 1820(1), 1820(2) to provide an upconverted signal 1824. A filter 1826 filters the upconverted signal 1824 to remove undesired signals caused by the frequency upconversion as well as noise in a receive frequency band. A power amplifier (PA) 1828 amplifies the upconverted signal 1824 from the filter 1826 to obtain the desired output power level and provides a transmit RF signal. The transmit RF signal is routed through a multiplexer or switch 1830 and transmitted via an antenna 1832 (e.g., where the multiplexer may be a duplexer or any other such multiplexing circuitry).

In the receive path, the antenna 1832 receives signals transmitted by base stations and provides a received RF signal, which is routed through the multiplexer or switch 1830 and provided to a low noise amplifier (LNA) 1834. The multiplexer or switch 1830 is designed to operate with a specific receive (RX)-to-TX multiplexer frequency separation, such that RX signals are isolated from TX signals. The received RF signal is amplified by the LNA 1834 and filtered by a filter 1836 to obtain a desired RF input signal. Down-conversion mixers 1838(1), 1838(2) mix the output of the filter 1836 with I and Q RX LO signals (e.g., LO_I and LO_Q) from an RX LO signal generator 1840) to generate I and Q baseband signals. The I and Q baseband signals are amplified by AMPs 1842(1), 1842(2) and further filtered by lowpass filters 1844(1), 1844(2) to obtain I and Q analog input signals, which are provided to the data processor 1806. In this example, the data processor 1806 includes analog-to-digital converters (ADCs) 1846(1), 1846(2) for converting the analog input signals into digital signals to be further processed by the data processor 1806.

In the wireless communications device 1800 of FIG. 18, the TX LO signal generator 1822 generates the I and Q TX LO signals used for frequency upconversion, while the RX LO signal generator 1840 generates the I and Q RX LO signals used for frequency downconversion. Each LO signal is a periodic signal with a particular fundamental frequency. A TX phase-locked loop (PLL) circuit 1848 receives timing information from the data processor 1806 and generates a control signal used to adjust the frequency and/or phase of the TX LO signals from the TX LO signal generator 1822. Similarly, an RX PLL circuit 1850 receives timing information from the data processor 1806 and generates a control signal used to adjust the frequency and/or phase of the RX LO signals from the RX LO signal generator 1840.

In some implementations, the filters 1826 and 1836 may also include vertically coupled components as described herein. In some such implementations, the filters 1826, 1836 may be positioned on the other side of the PA or LNA (e.g., along the signal path) from what is shown in FIG. 18. Examples, without limitation, include a set-top box, an entertainment unit, a navigation device, a communications device, a fixed location data unit, a mobile location data unit, a global positioning system (GPS) device, a mobile phone, a cellular phone, a smartphone, a session initiation protocol (SIP) phone, a tablet, a phablet, a server, a computer, a portable computer, a mobile computing device, a wearable computing device (e.g., a smartwatch, a health or fitness tracker, eyewear, smart glasses, augmented reality (AR) glasses, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, such as a vehicular head unit, avionics systems, a drone, and a multicopter.

The various operations of methods described above may be performed by any suitable means capable of performing the corresponding functions. The means may include various hardware and/or software component(s) and/or module(s), including, but not limited to a circuit, an application-specific integrated circuit (ASIC), or processor.

By way of aspect, an element, or any portion of an element, or any combination of elements described herein may be implemented as a "processing system" that includes one or more processors. Aspects of processors include microprocessors, microcontrollers, graphics processing units (GPUs), central processing units (CPUs), application processors, digital signal processors (DSPs), reduced instruction set computing (RISC) processors, systems on a chip (SoC), baseband processors, field programmable gate arrays (FPGAs), programmable logic devices (PLDs), state machines, gated logic, discrete hardware circuits, and other suitable hardware configured to perform the various functionality described throughout the disclosure. One or more processors in the processing system may execute software. Software shall be construed broadly to mean instructions, instruction sets, code, code segments, program code, programs, subprograms, software components, applications, software applications, software packages, routines, subroutines, objects, executables, threads of execution, procedures, functions, etc., whether referred to as software, firmware, middleware, microcode, hardware description language, or otherwise.

Accordingly, in one or more aspect embodiments, the functions or circuitry blocks described may be implemented in hardware, software, or any combination thereof. If implemented in software, the functions may be stored on or encoded as one or more instructions or code on a computer-readable medium. Computer-readable media includes computer storage media. Storage media may be any available media that can be accessed by a computer. By way of aspect, and not limitation, such computer-readable media can include a random-access memory (RAM), a read-only memory (ROM), an electrically erasable programmable ROM (EEPROM), optical disk storage, magnetic disk storage, other magnetic storage devices, combinations of the aforementioned types of computer-readable media, or any other medium that can be used to store computer executable code in the form of instructions or data structures that can be accessed by a computer. In some aspects, components described with circuitry may be implemented by hardware, software, or any combination thereof.

Illustrative aspects of the disclosure include:

Aspect 1. A radio frequency (RF) filter, comprising: a piezoelectric substrate having a first piezoelectric surface and a second piezoelectric surface opposite the first piezoelectric surface: a first electroacoustic resonator comprising a first interdigital transducer (IDT) disposed over the first piezoelectric surface of the piezoelectric substrate; and a second electroacoustic resonator comprising a second IDT disposed over the second piezoelectric surface of the piezoelectric substrate: wherein the second electroacoustic resonator is electrically coupled to the first electroacoustic resonator in series or in parallel.

Aspect 2. The RF filter of Aspect 1, wherein a thickness of the piezoelectric substrate is less than 20 times a minimum of a pitch of the first IDT and a pitch of the second IDT.

Aspect 3. The RF filter of Aspect 2, wherein the thickness of the piezoelectric substrate is greater than 0.1 times the minimum of the pitch of the first IDT and the pitch of the second IDT.

Aspect 4. The RF filter of any of Aspects 1 to 3, wherein the piezoelectric substrate comprises a first piezoelectric layer, the first piezoelectric layer comprising the first piezoelectric surface.

Aspect 5. The RF filter of any of Aspects 1 to 4, wherein the first piezoelectric layer further comprises the second piezoelectric surface; and wherein a thickness of the first piezoelectric layer is between 0.4 times of a minimum of a pitch of the first IDT and a pitch of the second IDT and 2 times the minimum of the pitch of the first IDT and the pitch of the second IDT.

Aspect 6. The RF filter of any of Aspects 1 to 5, wherein the piezoelectric substrate further comprises: a second piezoelectric layer comprising the second piezoelectric surface; and a spacer layer positioned between and in contact with the first piezoelectric layer and the second piezoelectric layer.

Aspect 7. The RF filter of any of Aspects 1 to 6, wherein a thickness of the piezoelectric substrate is less than 20 times a minimum of a pitch of the first IDT and a pitch of the second IDT.

Aspect 8. The RF filter of any of Aspects 6 to 7, wherein a thickness of the spacer layer is less than 10 times the minimum of the pitch of the first IDT and the pitch of the second IDT.

Aspect 9. The RF filter of any of Aspects 1 to 8, wherein the first piezoelectric layer and the second piezoelectric layer are made from a same piezoelectric material.

Aspect 10. The RF filter of any of Aspects 6 to 9, wherein a thickness of the spacer layer is greater than 10 times a maximum of the pitch of the first IDT and the pitch of the second IDT.

Aspect 11. The RF filter of Aspect 10, wherein a thickness of the spacer layer is less than 1.2 times the minimum of the pitch of the first IDT and the pitch of the second IDT.

Aspect 12. The RF filter of any of Aspects 1 to 11, further comprising a third electroacoustic resonator comprising a third IDT formed within the spacer layer over a surface of the first piezoelectric layer opposite the first piezoelectric surface.

Aspect 13. The RF filter of Aspect 12, further comprising a fourth electroacoustic resonator comprising a fourth IDT formed within the spacer layer over a surface of the second piezoelectric layer opposite the second piezoelectric surface.

Aspect 14. The RF filter of Aspect 13, wherein a thickness of the second piezoelectric layer is between 0.4 times a minimum of a pitch of the second IDT and a pitch of the fourth IDT and 2 times the minimum of the pitch of the second IDT and the pitch of the fourth IDT.

Aspect 15. The RF filter of any of Aspects 1 to 14, wherein a thickness of the first piezoelectric layer is between 0.4 times a minimum of a pitch of the first IDT and a pitch of the third IDT and 2 times the minimum of the pitch of the first IDT and the pitch of the third IDT.

Aspect 16. The RF filter of any of Aspects 1 to 15, wherein the spacer layer comprises a dielectric material.

Aspect 17. The RF filter of any of Aspects 1 to 16, further comprising a silicon substrate, wherein the silicon substrate has a cavity formed in a portion of a surface of the silicon substrate, and wherein the second piezoelectric surface of the piezoelectric substrate shares a boundary with the surface of the silicon substrate, aligned such that the second IDT fits within the cavity without contacting the substrate.

Aspect 18. The RF filter of any of Aspects 1 to 17, further comprising: a plurality of spacers positioned on the first piezoelectric surface of the piezoelectric substrate; and a cap mounted on the plurality of spacers, such that the first IDT is positioned in a gap between the first piezoelectric surface of the piezoelectric substrate and the cap.

Aspect 19. The RF filter of any of Aspects 1 to 18, wherein the first electroacoustic resonator and the second electroacoustic resonator are part of a ladder filter.

Aspect 20. The RF filter of Aspect 19, wherein the RF filter is integrated into an RF front-end circuit of a transceiver.

Aspect 21. The RF filter of any of Aspects 1 to 20, wherein a filter characteristic of the RF filter is based on electroacoustic coupling between the first electroacoustic resonator and the second electroacoustic resonator through the piezoelectric substrate.

Aspect 22. The RF filter of any of Aspects 1 to 21, wherein the first IDT and the second IDT overlap in a vertical direction such that a vertical projection across the piezoelectric substrate of an area on the first piezoelectric surface that includes the first IDT overlaps with an area on the second piezoelectric surface that includes the second IDT.

Aspect 23. The RF filter of any of Aspects 1 to 21, wherein the first IDT and the second IDT do not overlap in a vertical direction such that a vertical projection across the piezoelectric substrate of the first IDT does not overlap with an area on the second piezoelectric surface that includes the second IDT.

Aspect 24. The RF filter of any of Aspects 1 to 23, further comprising: an antenna; and processing circuitry, wherein the antenna and the processing circuitry are communicatively coupled via the RF filter, and wherein the RF filter is configured to filter RF signals traveling between the antenna and the processing circuitry.

Aspect 25. The RF filter of any of Aspects 1 to 24, wherein a first resonance value for the first electroacoustic resonator and a second resonance value for the second electroacoustic resonator depend on a coupling factor between the first resonator and the second resonator.

Aspect 26. The RF filter of Aspect 25, wherein the coupling factor has a value in accordance with any aspect described herein.

Aspect 27. The RF filter of Aspect 25, wherein the coupling factor is based at least in part of a distance between the first piezoelectric surface and the second piezoelectric surface of the piezoelectric substrate, a pitch of the first IDT, and a pitch of the second IDT.

Aspect 28. The RF filter of any of Aspects 25 to 27, wherein the distance between the first piezoelectric surface and the second piezoelectric surface of the piezoelectric substrate is a thickness of the piezoelectric substrate, and wherein the thickness of the piezoelectric substrate is between 0.4 times a pitch of the first IDT and 2 times a pitch of the first IDT.

Aspect 29. The RF filter of any of Aspects 25 to 28, wherein a thickness of the piezoelectric substrate is between 0.1 times a pitch of the first IDT and 20 times a pitch of the first IDT.

Aspect 30. The RF filter of any of Aspects 25 to 29, wherein the piezoelectric substrate comprises: a first piezoelectric layer comprising the first piezoelectric surface: a second piezoelectric layer comprising the second piezoelectric surface; and a spacer layer positioned between the first piezoelectric layer and the second piezoelectric layer, wherein the spacer layer shares a first boundary with the first piezoelectric layer at a first inner surface, and wherein the spacer layer shares a second boundary with the second piezoelectric layer at a second inner surface.

Aspect 31. The RF filter of any of Aspects 25 to 30, wherein a thickness of the piezoelectric substrate is a sum of a thickness of the first piezoelectric layer, a thickness of the second piezoelectric layer, and a thickness of the spacer layer, and wherein the thickness of the piezoelectric substrate is between 0.1 times a pitch of the second IDT and 20 times a pitch of the second IDT.

Aspect 32. The RF filter of any of Aspects 26 to 31, further comprising a third electroacoustic resonator comprising a third IDT formed within the spacer layer at the first boundary.

Aspect 33. The RF filter of any of Aspects 26 to 32, further comprising a fourth electroacoustic resonator comprising a fourth IDT formed within the spacer layer at the second boundary.

Aspect 34. The RF filter of any of Aspects 26 to 33, wherein a thickness of the first piezoelectric layer is between 0.1 times a pitch of the first IDT and 20 times a pitch of the first IDT.

Aspect 35. The RF filter of any of Aspects 26 to 34, wherein a thickness of the second piezoelectric layer is between 0.1 times the pitch of the second IDT and 20 times the pitch of the second IDT.

Aspect 36. The RF filter of any of Aspects 26 to 35, wherein a thickness of the spacer layer is greater than either 10 times the pitch of the first IDT or 10 times the pitch of the second IDT.

Aspect 37. The RF filter of any of Aspects 26 to 36, wherein a thickness of the spacer layer is between 0.1 times the pitch of the first IDT and 10 times the pitch of the first IDT.

Aspect 38. The RF filter of any of Aspects 26 to 37, wherein a first resonance value for the first electroacoustic resonator and a third resonance value for the third electroacoustic resonator depend on a first coupling factor between the first resonator and the third resonator; wherein a second resonance value for the second electroacoustic resonator and a fourth resonance value for the fourth electroacoustic resonator depend on a second coupling factor between the second resonator and the fourth resonator.

Aspect 39. The RF filter of any of Aspects 26 to 38, wherein a thickness of the first piezoelectric layer is between 0.4 times a pitch of the first IDT and 2 times a pitch of the first IDT: wherein a thickness of the second piezoelectric layer is between 0.4 times a pitch of the second IDT and 2 times a pitch of the second IDT; and wherein a thickness of the spacer layer is between 0.2 times the pitch of the first IDT and 1.2 times the pitch of the first IDT.

Aspect 40. The RF filter of any of Aspects 26 to 39, wherein a corresponding resonance value for each of the first electroacoustic resonator, the second electroacoustic resonator, the third electroacoustic resonator, and the fourth electroacoustic resonator depends on a corresponding coupling value for each other electroacoustic resonator of the first electroacoustic resonator, the second electroacoustic resonator, the third electroacoustic resonator, and the fourth electroacoustic resonator.

Aspect 41. The RF filter of any of Aspects 1 to 40, wherein the spacer layer comprises a dielectric material.

Aspect 42. The RF filter of any of Aspects 1 to 41, further comprising a silicon substrate having a first surface, wherein the silicon substrate comprises a cavity formed in a portion of the first surface of the silicon substrate, and wherein the second piezoelectric surface of the piezoelectric substrate shares a boundary with the first surface, aligned such that the second IDT fits within the cavity without contacting the silicon substrate.

Aspect 43. The RF filter of any of Aspects 1 to 42, further comprising: a plurality of spacers positioned on the first piezoelectric surface of the piezoelectric substrate; and a glass cap mounted on the plurality of spacers, such that the first IDT is positioned in a gap between the first piezoelectric surface of the piezoelectric substrate and the glass cap.

Aspect 44. The RF filter of any of Aspects 1 to 43, wherein the first electroacoustic resonator and the second electroacoustic resonator are part of a radio frequency (RF) ladder filter.

Aspect 45. An RF front-end circuit comprising the RF filter of any of Aspects 1 to 44, integrated into the RF front-end circuit of a transceiver.

Aspect 46. The RF filter of any of Aspects 1 to 45 integrated into a device selected from the group consisting of: a set-top box: an entertainment unit: a navigation device: a communications device: a fixed location data unit: a mobile location data unit: a global positioning system (GPS) device: a mobile phone: a cellular phone: a smartphone: a session initiation protocol (SIP) phone: a tablet: a phablet: a server: a computer: a portable computer: a mobile computing device: a wearable computing device: a desktop computer; a personal digital assistant (PDA): a monitor: a computer monitor: a television: a tuner: a radio: a satellite radio: a music player: a digital music player: a portable music player: a digital video player: a video player: a digital video disc (DVD) player: a portable digital video player: an automobile: a vehicle component: avionics systems: a drone; and a multicopter.

Aspect 47. An acoustic wave (AW) filter comprising: a piezoelectric substrate comprising: a first piezoelectric layer having a first piezoelectric surface and a second piezoelectric surface opposite the first piezoelectric surface: a second piezoelectric layer having a third piezoelectric surface and a fourth piezoelectric surface opposite the third piezoelectric surface; and a spacer layer between the first piezoelectric layer and the second piezoelectric layer, wherein the second piezoelectric surface is opposite the third piezoelectric surface across the spacer layer: a first interdigital transducer (IDT) formed over the first piezoelectric surface of the first piezoelectric layer; and a second IDT formed over the second piezoelectric surface of the first piezoelectric layer: a third IDT formed over the third piezoelectric surface of the second piezoelectric layer; and a fourth IDT formed over the fourth piezoelectric surface of the second piezoelectric layer.

Aspect 48. The AW filter of Aspect 47, wherein the spacer layer comprises a dielectric support structure for an air gap.

Aspect 49. The AW filter of any of Aspects 47 to 48, wherein a first filter characteristic of the AW filter is based on electroacoustic coupling between the first IDT and the second IDT across the first piezoelectric layer, and wherein a second filter characteristic of the AW filter is based on electroacoustic coupling between the third IDT and the fourth IDT across the second piezoelectric layer.

Aspect 50. The AW filter of Aspect 47, wherein the first IDT and the second IDT do not overlap in a vertical direction such that a vertical projection of the first IDT projection across the first piezoelectric substrate does not overlap with an area on the second piezoelectric surface that includes the second IDT.

Aspect 51. The AW filter of any of Aspects 47 to 50 in accordance with any vertically coupled IDT structure described herein.

Aspect 52. A method of fabricating an acoustic wave (AW) filter package, the method comprising: creating one or more via holes through a piezoelectric substrate, wherein the piezoelectric substrate has a first piezoelectric surface and a second piezoelectric surface opposite the first piezoelectric surface: fabricating one or more conductive vias from the first piezoelectric surface to the second piezoelectric surface using the one or more via holes: fabricating a first acoustic layer over the first piezoelectric surface of the piezoelectric substrate, wherein the first acoustic layer comprises one or more first interdigital transducers (IDTs) and one or more connections from the one or more first IDTs to the one or more conductive vias: deposit one or more spacers over the first piezoelectric surface of the piezoelectric substrate, using a resist layer to protect the one or more first IDTs: bonding the one or more spacers to a silicon substrate to mount the piezoelectric substrate over the silicon substrate using the one or more spacers; thinning the piezoelectric substrate to a selected thickness by removing material from the second piezoelectric surface of the piezoelectric substrate; and fabricating a second acoustic layer over the second piezoelectric surface of the piezoelectric substrate, wherein the second acoustic layer comprises one or more second IDTs connected to the one or more first IDTs via the one or more conductive vias, and wherein the one or more first IDTs and the one or more second IDTs are provided as part of a radio frequency filter circuit.

Aspect 53. The method of Aspect 52, wherein a projection of the one or more first IDTs onto the second piezoelectric surface in a perpendicular direction from the first piezoelectric surface does not overlap with the one or more second IDTs.

Aspect 54. The method of any of Aspects 52 to 53, wherein a filter characteristic of the AW filter package filter is based on electroacoustic coupling between the one or more first IDTs and the one or more second IDTs through the piezoelectric substrate; and wherein the electroacoustic coupling through the piezoelectric substrate is based on an overlap between the one or more first IDTs and the one or more second IDTs in a vertical direction across the piezoelectric substrate.

Aspect 55. The method of Aspect 52 performed in conjunction with fabrication of any vertically coupled IDT structure described herein.

Aspect 56. A storage medium comprising instructions that, when executed by processing circuitry of a device, cause the device to perform operations in accordance with any aspect above.

Aspect 57. A method for filtering a signal in using an RF or AW filter in accordance with any aspect described.

Aspect 58. A device comprising means for filtering a signal in accordance with any aspect above.

Aspect 59. A radio frequency (RF) filter, comprising: a piezoelectric substrate having a first piezoelectric surface and a second piezoelectric surface opposite the first piezoelectric surface; a first electroacoustic resonator comprising a first interdigital transducer (IDT) formed on or over the first piezoelectric surface of the piezoelectric substrate; and a second electroacoustic resonator comprising a second IDT formed on or over the second piezoelectric surface of the piezoelectric substrate; wherein the second electroacoustic resonator is electrically coupled to the first electroacoustic resonator in series or in parallel.

Aspect 60. The RF filter of aspect 58 replacing aspect 1 in accordance with any of aspects 2 through 46.

The phrase "coupled to" and the term "coupled" refers to any component that is physically connected to another component either directly or indirectly, and/or any component that is in communication with another component (e.g., connected to the other component over a wired or wireless connection, and/or other suitable communication interface) either directly or indirectly. Generally, where there are operations illustrated in figures, those operations may have corresponding counterpart means-plus-function components with similar numbering.

As used herein, the term "determining" encompasses a wide variety of actions. For aspect, "determining" may include calculating, computing, processing, deriving, investigating, looking up (e.g., looking up in a table, a database, or another data structure), ascertaining, and the like. Also, "determining" may include receiving (e.g., receiving information), accessing (e.g., accessing data in a memory), and the like. Also, "determining" may include resolving, selecting, choosing, establishing, and the like.

It is to be understood that the claims are not limited to the precise configuration and components illustrated above. Various modifications, changes and variations may be made in the arrangement, operation and details of the methods and apparatus described above without departing from the scope of the claims.

What is claimed is:

1. A radio frequency (RF) filter, comprising:
   a piezoelectric substrate having a first piezoelectric surface and a second piezoelectric surface opposite the first piezoelectric surface;
   a first electroacoustic resonator comprising a first interdigital transducer (IDT) disposed over the first piezoelectric surface of the piezoelectric substrate;
   a second electroacoustic resonator comprising a second IDT disposed over the second piezoelectric surface of the piezoelectric substrate; and
   a silicon substrate, wherein the silicon substrate has a cavity formed in a portion of a surface of the silicon substrate,
   wherein the second piezoelectric surface of the piezoelectric substrate shares a boundary with the surface of the silicon substrate, aligned such that the second IDT fits within the cavity without contacting the silicon substrate, and
   wherein the second electroacoustic resonator is electrically coupled to the first electroacoustic resonator.

2. The RF filter of claim 1, wherein a thickness of the piezoelectric substrate is less than 20 times a minimum of a pitch of the first IDT and a pitch of the second IDT.

3. The RF filter of claim 2, wherein the thickness of the piezoelectric substrate is greater than 0.1 times the minimum of the pitch of the first IDT and the pitch of the second IDT.

4. The RF filter of claim 1, wherein the piezoelectric substrate comprises a first piezoelectric layer, the first piezoelectric layer comprising the first piezoelectric surface.

5. The RF filter of claim 4, wherein the first piezoelectric layer further comprises the second piezoelectric surface; and
   wherein a thickness of the first piezoelectric layer is between 0.4 times of a minimum of a pitch of the first IDT and a pitch of the second IDT and 2 times the minimum of the pitch of the first IDT and the pitch of the second IDT.

6. The RF filter of claim 4, wherein the piezoelectric substrate further comprises:
   a second piezoelectric layer comprising the second piezoelectric surface; and
   a spacer layer positioned between and in contact with the first piezoelectric layer and the second piezoelectric layer.

7. The RF filter of claim 6, wherein a thickness of the piezoelectric substrate is less than 20 times a minimum of a pitch of the first IDT and a pitch of the second IDT.

8. The RF filter of claim 7, wherein a thickness of the spacer layer is less than 10 times the minimum of the pitch of the first IDT and the pitch of the second IDT.

9. The RF filter of claim 8, wherein the first piezoelectric layer and the second piezoelectric layer are made from a same piezoelectric material.

10. The RF filter of claim 7, wherein a thickness of the spacer layer is greater than 10 times a maximum of the pitch of the first IDT and the pitch of the second IDT.

11. The RF filter of claim 7,
    wherein a thickness of the spacer layer is less than 1.2 times the minimum of the pitch of the first IDT and the pitch of the second IDT.

12. The RF filter of claim 6, further comprising a third electroacoustic resonator comprising a third IDT formed within the spacer layer on a surface of the first piezoelectric layer opposite the first piezoelectric surface.

13. The RF filter of claim 12, further comprising a fourth electroacoustic resonator comprising a fourth IDT formed within the spacer layer on a surface of the second piezoelectric layer opposite the second piezoelectric surface.

14. The RF filter of claim 13, wherein a thickness of the second piezoelectric layer is between 0.4 times a minimum of a pitch of the second IDT and a pitch of the fourth IDT and 2 times the minimum of the pitch of the second IDT and the pitch of the fourth IDT.

15. The RF filter of claim 12, wherein a thickness of the first piezoelectric layer is between 0.4 times a minimum of a pitch of the first IDT and a pitch of the third IDT and 2 times the minimum of the pitch of the first IDT and the pitch of the third IDT.

16. The RF filter of claim 6, wherein the spacer layer comprises a dielectric material.

17. The RF filter of claim 1, further comprising:
    an antenna; and
    processing circuitry, wherein the antenna and the processing circuitry are communicatively coupled via the RF filter, and wherein the RF filter is configured to filter RF signals traveling between the antenna and the processing circuitry.

18. The RF filter of claim 1, further comprising:
    a plurality of spacers positioned on the first piezoelectric surface of the piezoelectric substrate; and
    a cap mounted on the plurality of spacers, such that the first IDT is positioned in a gap between the first piezoelectric surface of the piezoelectric substrate and the cap.

19. The RF filter of claim 1, wherein the first electroacoustic resonator and the second electroacoustic resonator are part of a ladder filter.

20. The RF filter of claim 1, wherein the RF filter is integrated into an RF front-end circuit of a transceiver.

21. The RF filter of claim 1, wherein a filter characteristic of the RF filter is based on electroacoustic coupling between the first electroacoustic resonator and the second electroacoustic resonator through the piezoelectric substrate.

22. The RF filter of claim 21, wherein the first IDT and the second IDT overlap in a vertical direction such that a vertical projection across the piezoelectric substrate of an area on the first piezoelectric surface that includes the first IDT overlaps with an area on the second piezoelectric surface that includes the second IDT.

23. An acoustic wave (AW) filter comprising:
a piezoelectric substrate comprising:
- a first piezoelectric layer having a first piezoelectric surface and a second piezoelectric surface opposite the first piezoelectric surface;
- a second piezoelectric layer having a third piezoelectric surface and a fourth piezoelectric surface opposite the third piezoelectric surface; and
- a spacer layer between the first piezoelectric layer and the second piezoelectric layer, wherein the second piezoelectric surface is opposite the third piezoelectric surface across the spacer layer;
- a first interdigital transducer (IDT) disposed over the first piezoelectric surface of the first piezoelectric layer; and
- a second IDT disposed over the second piezoelectric surface of the first piezoelectric layer, wherein the first IDT and the second IDT do not overlap in a vertical direction such that a vertical projection of the first IDT projection across the first piezoelectric substrate does not overlap with an area on the second piezoelectric surface that includes the second IDT;
- a third IDT disposed over the third piezoelectric surface of the second piezoelectric layer;
- a fourth IDT disposed over the fourth piezoelectric surface of the second piezoelectric layer.

24. The AW filter of claim 23, wherein a first filter characteristic of the AW filter is based on electroacoustic coupling between the first IDT and the second IDT across the first piezoelectric layer, and wherein a second filter characteristic of the AW filter is based on electroacoustic coupling between the third IDT and the fourth IDT across the second piezoelectric layer.

25. The AW filter of claim 23, wherein the spacer layer comprises a dielectric material.

26. A radio frequency (RF) filter, comprising:
a piezoelectric substrate comprising:
- a first piezoelectric layer comprising a first piezoelectric surface;
- a second piezoelectric layer comprising a second piezoelectric surface opposite the first piezoelectric surface; and
- a spacer layer positioned between and in contact with the first piezoelectric layer and the second piezoelectric layer;
- a first electroacoustic resonator comprising a first interdigital transducer (IDT) disposed over the first piezoelectric surface of the piezoelectric substrate;
- a second electroacoustic resonator comprising a second IDT disposed over the second piezoelectric surface of the piezoelectric substrate, wherein the second electroacoustic resonator is electrically coupled to the first electroacoustic resonator in series or in parallel; and
- a third electroacoustic resonator comprising a third IDT formed within the spacer layer on a surface of the first piezoelectric layer opposite the first piezoelectric surface.

27. The RF filter of claim 26, further comprising a fourth electroacoustic resonator comprising a fourth IDT formed within the spacer layer on a surface of the second piezoelectric layer opposite the second piezoelectric surface.

28. A method of fabricating an acoustic wave (AW) filter package, the method comprising:
- forming one or more via holes through a piezoelectric substrate, wherein the piezoelectric substrate has a first piezoelectric surface and a second piezoelectric surface opposite the first piezoelectric surface;
- fabricating one or more conductive vias from the first piezoelectric surface to the second piezoelectric surface using the one or more via holes;
- fabricating a first acoustic layer over the first piezoelectric surface of the piezoelectric substrate, wherein the first acoustic layer comprises one or more first interdigital transducers (IDTs) and one or more connections from the one or more first IDTs to the one or more conductive vias;
- depositing one or more spacers on the first piezoelectric surface of the piezoelectric substrate, using a resist layer to protect the one or more first IDTs;
- bonding the one or more spacers to a silicon substrate to mount the piezoelectric substrate on the silicon substrate using the one or more spacers;
- thinning the piezoelectric substrate to a selected thickness by removing material from the second piezoelectric surface of the piezoelectric substrate; and
- fabricating a second acoustic layer over the second piezoelectric surface of the piezoelectric substrate, wherein the second acoustic layer comprises one or more second IDTs connected to the one or more first IDTs via the one or more conductive vias.

29. The method of claim 28, wherein a projection of the one or more first IDTs onto the second piezoelectric surface in a perpendicular direction from the first piezoelectric surface does not overlap with the one or more second IDTs.

30. The method of claim 29, wherein a filter characteristic of the AW filter package filter is based on electroacoustic coupling between the one or more first IDTs and the one or more second IDTs through the piezoelectric substrate; and
wherein the electroacoustic coupling through the piezoelectric substrate is based on an overlap between the one or more first IDTs and the one or more second IDTs in a vertical direction across the piezoelectric substrate.

* * * * *